United States Patent
Takahashi et al.

(10) Patent No.: US 6,947,345 B2
(45) Date of Patent: Sep. 20, 2005

(54) SEMICONDUCTOR MEMORY DEVICE

(75) Inventors: Hiroyuki Takahashi, Kanagawa (JP); Hideo Inaba, Kanagawa (JP); Atsushi Nakagawa, Kanagawa (JP)

(73) Assignee: NEC Electronics Corporation (JP)

( * ) Notice: Subject to any disclaimer, the term of this patent is extended or adjusted under 35 U.S.C. 154(b) by 23 days.

(21) Appl. No.: 10/473,656

(22) PCT Filed: Mar. 28, 2002

(86) PCT No.: PCT/JP02/03106

§ 371 (c)(1), (2), (4) Date: Feb. 17, 2004

(87) PCT Pub. No.: WO02/082454

PCT Pub. Date: Oct. 17, 2002

(65) Prior Publication Data

US 2004/0130958 A1   Jul. 8, 2004

(30) Foreign Application Priority Data

Apr. 2, 2001  (JP) ........................ 2001-103630

(51) Int. Cl.⁷ ............................................... G11C 7/00
(52) U.S. Cl. ..................................... 365/222; 365/229
(58) Field of Search ................................ 365/222, 229, 365/226, 227

(56) References Cited

U.S. PATENT DOCUMENTS 4,616,346 A * 10/1986 Nakaizumi et al. ......... 365/229
4,716,551 A * 12/1987 Inagaki ....................... 365/222
6,765,839 B2 * 7/2004 Park ............................ 365/222

FOREIGN PATENT DOCUMENTS

| EP | 1 235 228 A1 | 8/2002 |
| JP | 1-159893 | 6/1989 |
| JP | 4-259986 | 9/1992 |
| WO | WO 01/41149 A1 | 6/2001 |

* cited by examiner

*Primary Examiner*—Tan T. Nguyen
(74) *Attorney, Agent, or Firm*—Choate Hall & Stewart LLP

(57) ABSTRACT

A semiconductor memory device is provided, which is capable of effectively reducing a current comsumption caused by a self-refresh operation in a stand-by mode.

In the refresh operation in the stand-by mode, under the control by a refresh control circuit 8B, firstly, a suppression is made for current driving abilities of sense amplifiers 70A~70D provided for amplifying data signals appearing on bit lines, and secondly, an expansion is made of a pulse width of a row enable signal RE, which defines a period of time for selecting word lines WL, and thirdly, parallel activations of plural word lines are made based on the row enable signal RE with the expanded pulse width, thereby reducing the frequency of operations of the circuit system associated with the refresh operations, resulting in a suppression of the current consumption.

17 Claims, 22 Drawing Sheets

(a)

(b)

SEMICONDUCTOR MEMORY DEVICE

TECHNICAL FIELD

The present invention relates to a non-synchronous semiconductor memory device such as a pseudo SRAM (Static Random Access Memory) which includes DRAM (Dynamic Random Access Memory) as a basic element, and more particularly to a technique for refresh operation in a stand-by mode.

BACKGROUND ART

The pseudo SRAM has conventionally been known as a semiconductor memory device which includes DRAM as a basic element and which is configured to be operated quite similarly to SRAM. Such the pseudo SRAM is a memory of non-synchronous type in an external viewpoint. The pseudo SRAM includes DRAM as the basic element, for which reason it is necessary to periodically refresh memory data.

A conventional example of the non-synchronous semiconductor memory device including DRAM as the basic element will be described below with attracting a refresh circuit therein.

FIG. 16 shows a semiconductor memory device (the first prior art) of this non-synchronous type including DRAM as the basic element, which is also dislocated by the inventors in International Publication No. W001/41149A1. In this drawing, an address ADD is a signal given from the outside. The address ADD includes row addresses designating rows of a memory cell array to be described later, and column addresses designating columns thereof.

An address input system 1 latches the address ADD and outputs an internal address LADD. An address transition detector circuit (ATD) 2 detects any transition of the internal address LADD and outputs a one-shot pulse signal SATD. An address multiplexer (MUX) 3 outputs any one of the internal address LADD and a refresh address RADD to be described below as an address MADD.

A row decoder 60 decodes the address MADD for selecting a row of a memory cell array 70. The memory cell array 70 comprises a matrix array of memory cells similarly to those of the general-purpose DRAM. A sense amplifier 71 amplifies a data signal on a bit line for read operation. A column decoder 72 selects a column of the memory cell array 70. A pre-charge circuit (not illustrated) for bit lines is arranged which is accompanied to the sense amplifier 71.

A refresh timer circuit 8G times a period of time for refresh operations. A refresh control circuit 8H controls a series of refresh operations. Upon an external access, the refresh control circuit 811 generates a refresh control signal REFA for controlling the timings of the refresh operations and another refresh control signal REFB for controlling the timings of the self-refresh operations.

A refresh address generator circuit 8J generates am address RADD (hereinafter referred to as "refresh address") to be used for the refresh operation. An internal pulse generator circuit 10 generates a row enable signal RE, a sense amplifier enable signal SE, a pre-charge enable signal PE, and a column enable signal CE.

In addition to the above-described circuits, there are further provided a circuit system for controlling read and write operations, another circuit system for generating a substrate potential of the memory cell array, and still another circuit system for reading and writing data from and into the memory cell array.

The refresh operations of the semiconductor memory device in accordance with the prior art shown in FIG. 16 will subsequently be described with reference to a timing chart of FIG. 17, wherein FIG. 17(a) shows timing waveforms of the refresh operation in the read mode, while FIG. 17(b) shows timing waveforms of the other refresh operation in the stand-by mode.

A. Refresh Operation in Read Mode:

In the read mode, this semiconductor memory device sequentially performs a refresh operation and a read operation in the same cycle in view of the specification thereof.

Namely, the address input system 1 latches the externally-given address A0 as the address ADD, and outputs this address A0 as the internal address LADD. The address transition detector circuit 2 detects the transition of the internal address LADD and then outputs the one-shot pulse signal SATD.

The refresh control circuit 8H receives the one-shot pulse signal SATD to start the refresh operation. After the refresh operation has been started, then the refresh address generator circuit 8J generates and outputs a refresh row address R0 as the refresh address RADD. An address multiplexer 3 supplies the refresh address RADD (namely the refresh row address R0) as the address MADD to the row decoder 60.

On the other hand, the internal pulse generator circuit 10 receives an input of a refresh control signal REFB from the refresh control circuit 8H, and outputs the row enable signal RE and the sense amplifier enable signal SE. The row decoder 60 receives inputs of the address MADD and the row enable signal RE and selects a word line designated by the refresh address R0 for a predetermined period of time defined by the row enable signal RE, whereby a data signal from a memory cell connected to the selected word line appears on a bit line in a memory cell array 70, and the sense amplifier 71 amplifies this data signal and re-writes the amplified signal into the memory cell. As a result, data for memory cells on a single row designated by the refresh row address R0 has been refreshed. Subsequently, in each cycle, the refresh will be made to each row designated by each refresh address sequentially generated by the refresh address generator circuit 8J.

After the refresh operation has been finished to the row designated by the refresh row address R0, then the read operation is made in the same cycle. Namely, the word line designated by the internal address LADD is selected, whereby data are read from the memory cells connected to this word line. Concretely, the address multiplexer 3 receives the internal address LADD outputted from the address input system 1, and then supplies the internal address LADD as the address MADD to the row decoder 60. The row decoder 60 selects a word line designated by an input row address X0 as the address MADD. Thereafter, the sense amplifier 71 amplifiers the data signal having appeared on the bit line in the memory cell array 70, whereby the data stored in the memory cell are read out.

As described above, in the read mode, the transition of the externally supplied address is detected by the address transition detector circuit (ATD) 2, thereby to start the refresh and read operations. If a last request of access from the outside appears and a counted past time becomes beyond a predetermined refresh time period, after the last detection of the address transition is made by the address transition detector circuit (ATD) 2, then the self-refresh operation starts even no external access request is present.

B. Refresh Operation in Stand-By Mode:

In the stand-by mode, the detection of the address transition by the address transition detector circuit (ATD) 2 is stopped, so that even if the address transition appears, then only the self-refresh operation is made without any read operation. Concretely, in the stand-by mode, the refresh timer circuit 8G times a time interval of the self-refresh operations. The refresh control circuit 8H enables the refresh address generator circuit 8J to generate the refresh row address R0 as the refresh address RADD at a timing obtained through timing operation by the refresh timer circuit 8G. The address multiplexer 3 receives a refresh row address R0 as the refresh address RADD and supplies the refresh row address R0 as the address MADD to the row decoder 60.

On the other hand, the refresh control circuit 8H outputs the refresh control signal REFB for enabling the internal pulse generator circuit 10 to generate the row enable signal RE at an appropriate timing. The row decoder 60 receives the refresh row address R0 as the address MADD from the address multiplexer 3, and then selects a word line designated by the refresh row address R0 for a predetermined period of time defined by the row enable signal RE. Thereafter, data from the memory cells connected to the selected word line are amplified by the sense amplifier and then rewritten into the memory cells. Subsequently, in the stand-by mode, according to the timings generated by the refresh timer circuit 8G, sequential refresh operations are made to rows one-by-one designated by the respective refresh addresses sequentially generated by the refresh address generator circuit 8J.

The above-described conventional semiconductor memory device (the first prior art) is provided with a circuit for adjusting an external access and a self-refresh so that the self-refresh is made in the access mode, whereby the semiconductor memory device may be operable similarly to the non-synchronous SRAM without external control to the refresh. Notwithstanding, in the access for read and write operations, an external refresh is made by supplying a refresh timing from the outside, while in the stand-by mode, a self-refresh is made. A variety of conventional proposals has been made to such the semiconductor memory device.

In Japanese laid-open patent publication No. 1-159893 (the second prior art), it is mentioned that a refresh cycle for self-refresh is longer than another refresh cycle for external refresh in order to reduce a power consumption for the self-refresh.

In Japanese laid-open patent publication No. 4-259986 (the third prior art), it is mentioned that since the hold ability of the memory cell is dropped upon drop of the power voltage, a cycle setting circuit is provided for setting automatically a self-refresh cycle, depending upon variation of the power voltage, so that the self-refresh cycle is set shorter under the low power voltage, while the self-refresh cycle is set longer under the high power voltage.

By the way, the stand-by mode strictly limits the current consumption depending upon its specification, and particularly, a small current comsumption is desired for application to mobile terminals. Notwithstanding, in accordance with the above-described prior arts, in the stand-by mode, a single word line is selected for one-time refresh operation (refresh operation for a single row) similarly to the refresh operations in the active mode. For this reason, all the circuit systems associated with the refresh operations are operated for every refresh for one-row. This makes it difficult to effectively reduce the current consumption associated with the refresh operation.

An extension of the refresh cycle reduces the frequency of operations of the circuit systems associated with the refresh operations in order to reduce the current consumption. In accordance with the above-described first prior art, it is necessary that the refresh operations are made for all rows by sequentially selecting all word lines within a predetermined period of time which ensures the hold of data in the memory cells. This means that the time for each refresh operation is limited. This makes it difficult to effectively extend the refresh cycle and effectively reduce the current consumption.

In the above-circumstances, it is an object of the present invention to provide a semiconductor memory device which is capable of effectively reducing the current comsumption associated with the self-refresh operation in the stand-by mode.

SUMMARY OF THE INVENTION

In order to solve the above-issues, the present invention has the following constitutions.

A semiconductor memory device of the present invention has a plurality of memory cells which need refreshes for memory holds, as well as a stand-by mode inhibiting read and write operations of external data from and into the memory cells, and an active mode enabling the read and write operations of external data from and into the memory cells, wherein the semiconductor memory device includes a self-refresh timer circuit which outputs refresh pulses for a self-refresh at a first cycle in the active mode and for another self-refresh at a second cycle longer than the first cycle in the stand-by mode. The above-configuration further reduces a current necessary for self-refresh in the stand-by mode as compared to another current necessary for another self-refresh in the active mode.

Further, in accordance with the present invention, the self-refresh timer circuit may be adopted so that a time period until the refresh cycle is changed from the second cycle to the first cycle after the stand-by mode is changed to the active mode is longer in average than another time period until the refresh cycle is changed from the first cycle to the second cycle after the active mode is changed to the stand-by mode. The above-configuration avoids any disappearance of contents stored in the memory cells even if the active mode and the stand-by mode are frequently switched.

In accordance with another aspect of the present invention, the semiconductor memory device of non-synchronous type is configured to automatically perform a refresh operation, wherein the semiconductor memory device includes a control system for controlling a current driving ability of a sense amplifier provided for amplifying a data signal appearing on a bit line involved in a refresh operation in a stand-by mode, and the control system also expands a pulse width of a pulse signal which defines a period of time for selecting a word line, and the control system activates in parallel the plurality of word lines, based on the pulse signal with the expanded pulse width, (the control system may, for example, include below-mentioned constitutional elements, such as a refresh timer 8A, a refresh control circuit 8B, a refresh address generator circuit 8C, a selector 9, an internal pulse generator circuit 10, and a gate circuit 4).

If a current refresh operation is interrupted when an operation mode is switched from the stand-by mode into the active mode, then the control system performs, in a subsequent active mode, the refresh operation again to a word line designated by a row address which has been subject to the interrupted refresh.

The control system detects a switch of the operation mode from the active mode into the stand-by mode, and the control system activates in parallel the plurality of word lines including a word line designated by the row address to be subject to the refresh in the active mode.

The control system continues the refresh operation in the active mode until a new refresh cycle arrives in the stand-by mode, after the operation mode has been switched from the active mode into the stand-by mode.

The control system generates, as the pulse signal, a signal with a pulse width necessary for activating at least the sense amplifier.

The control system controls the current driving ability to be small, which is of the sense amplifier and also expands a pulse width of the pulse signal, as long as data stored in a memory cell subject to the refresh is recovered.

In accordance with the present invention, a refresh method of a semiconductor memory device of non-synchronous type which is configured to automatically perform a refresh operation, includes: (a) controlling a current driving ability of a sense amplifier provided for amplifying a data signal appearing on a bit line involved in a refresh operation in a stand-by mode; (b) expanding a pulse width of a pulse signal which defines a period of time for selecting a word line; and (c) activating in parallel the plurality of word lines, based on the pulse signal with the expanded pulse width.

In accordance with another aspect of the present invention, a refresh method of a semiconductor memory device of non-synchronous type which is configured to automatically perform a refresh operation, includes: a stand-by mode inhibiting read and write operations of data from and into the memory cells, and an active mode enabling the read and write operations of data from and into the memory cells, wherein a self-refresh cycle in the stand-by mode is longer than another self-refresh cycle in the active mode. This refresh method more reduces the self-refresh current in the stand-by mode than in the self-refresh current in the active mode.

DETAILED DESCRIPTION OF VARIOUS EMBODIMENTS

The embodiments of the present invention will hereinafter be described with reference to the drawings.

(First Embodiment)

The first embodiment of the present invention will be described. A semiconductor memory device according to the first embodiment is a pseudo SRAM which uses the same memory cells as the DRAM (dynamic random access memory), and which is operable in accordance with the same specification as the SRAM (static random access memory), wherein the pseudo SRAM is configured so that a detection is made of an address or a chip select signal externally inputted, thereby to generate an internal pulse signal, whereby the refresh operation and the read and write operations are sequentially conducted in the same cycle by triggering this pulse signal. In this invention, "read/write operation" means any of "read operation" and "write operation".

Figure 1:
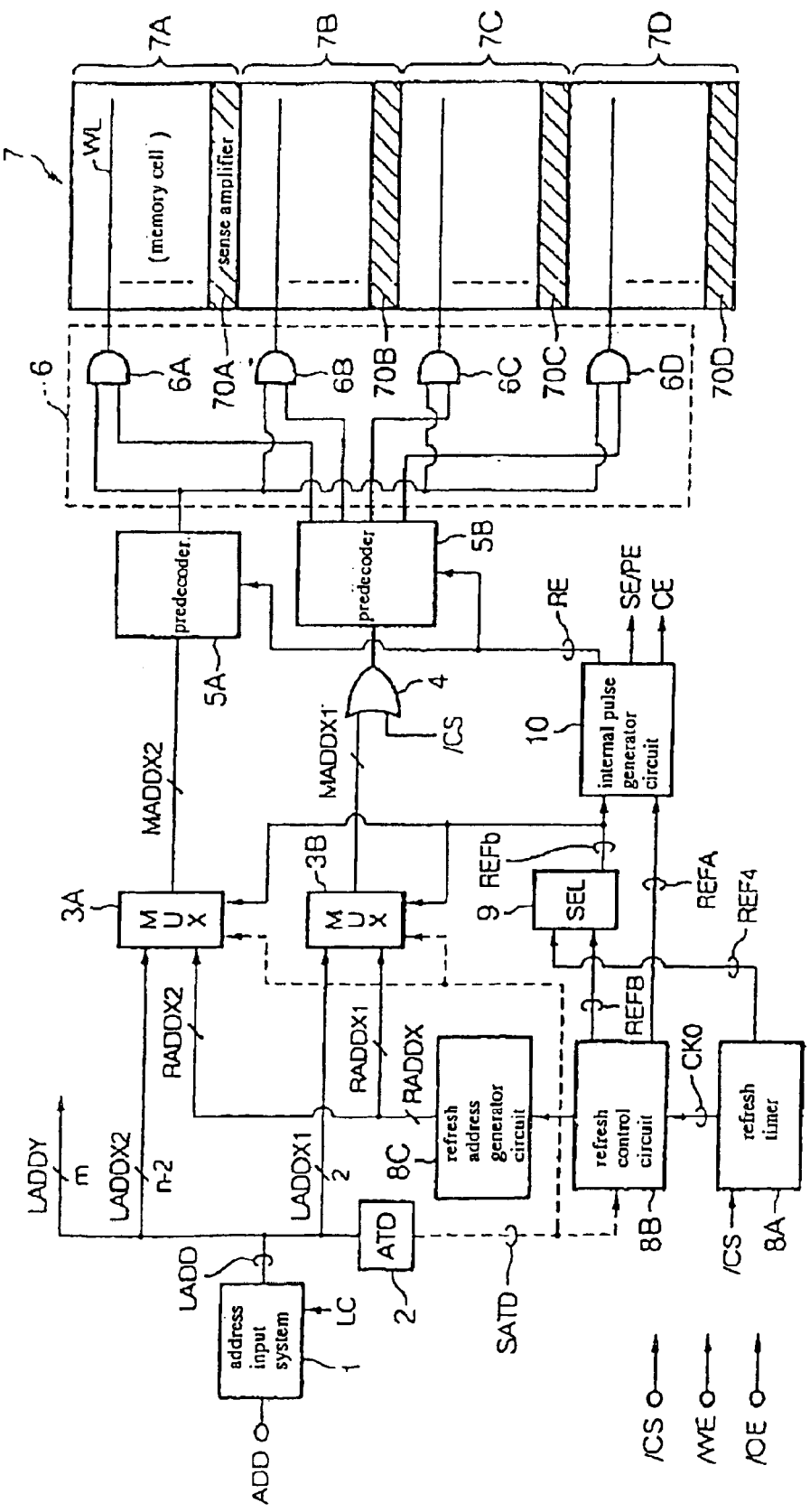
FIG. 1 is a block diagram illustrative of a configuration of a semiconductor memory device in accordance with a first embodiment of the present invention.

FIG. 1 shows an entire configuration of the semiconductor memory device in accordance with this embodiment.

In this drawing, an address ADD is a signal given from the outside to this semiconductor memory device, and includes a row address of n-bits (n: natural number) and a column address of m-bits. Other than this address ADD, externally given signals include a chip select signal/CS, a write enable signal/WE, and an output enable signal/OE.

The chip select signal/CS is a most significant control signal for controlling the operation state of the semiconductor memory device, wherein the high level thereof places the semiconductor memory device into the stand-by mode, while the low level thereof places the semiconductor memory device into the active mode (read/write mode). The write enable signal/WE is a signal for switching the read mode and the write mode. The output enable signal/OE is a control signal for controlling the output state (impedance state) of a buffer circuit for outputting data to the outside.

An address input system 1 is provided for taking an external given address ADD into the inside of the semiconductor memory device. The address input system 1 has a function of latching this address as an internal address LADD for a predetermined period of time. The row address of n-bits of the internal address LADD comprises an internal address LADDX1 of lower significant 2-bits, and an internal address LADDX2 of higher significant (n–2)-bits, wherein the internal addresses LADDX1 and LADDX2 are outputted. The column address of m-bits of the internal address LADD comprises an internal address LADDY which is outputted.

The address input system 1 is supplied with a latch signal LC as a trigger for latching the address ADD. The latch signal LC is generated upon detection of a transition (change) of the address by a below-mentioned address transition detector circuit. The latch signal LC is activated for read operation following to the refresh operation. In the period of time for the read operation, the externally designated address ADD remains latched by the address input system 1 for a stable hold inside without receiving any influence of an operational noise.

An address transition detector circuit (ATD) 2 detects the transition of the internal address LADD and outputs a positive one-shot pulse as an address transition detecting signal SATD if the chip select signal/CS is placed in an active state (low level). If the chip select signal/CS is transitioned from the high level to the low level and the operation mode is switched from the stand-by mode into the active mode, then the address transition detector circuit 2 also outputs the positive one-shot pulse. The detection of the transition of the internal address LADD is made to each bit signals of the address ADD. If any of the bit signals is transitioned, then the address transition detecting signal SATD is outputted.

An address multiplexer (MUX) 3A selects higher significant (n–2)-bits of the row address which is subject to the decode for selecting the row of the memory cell array. Concretely, if a refresh control signal REFB is in the high level, then the address multiplexer 3A selects the internal address LADDX2 and outputs the same as an internal address MADDX2, after a predetermined time has passed from rising the address transition detecting signal SATD.

Another address multiplexer (MUX) 3B selects lower significant 2-bits of the row address which is subject to the decode for selecting the row of the memory cell array. Similarly to the address multiplexer (MUX) 3A, the address multiplexer 3B selects one of the internal address LADDX1 and a refresh address RADDX1 at an appropriate timing and outputs the selected one as an internal address MADDX1 of 2-bits, based on the address transition detecting signal SATD and the refresh control signal REFB.

A gate circuit 4 degenerates complementary signals into the same signal level if the chip select signal/CS is in the high level, wherein the complementary signals represent respective bits of the internal address MADDX1 outputted from the multiplexer 3B. The output signal from the gate circuit 4 is supplied to a pre-decoder 5B, whereby the pre-decoder 5B concurrently selects word lines for four rows which should be exclusively selected by the address MADDX1 of the 2-bits.

A pre-decoder 5A pre-decodes the address MADDX2 of the higher significant bits, and generates a signal for selecting word lines for four rows as a unit. A pre-decoder 5B pre-decodes the address MADDX1 of the lower significant bits, and generates another signal for selecting word lines.

A row decoder 6 comprises plural periods of a unit which comprises four logic gates 6A~6D which receive combinations of signals outputted from the above-described pre-decoders 5A and 5B. This row decoder 6 decodes signals outputted from the pre-decoders 5A and 5B, and drives word lines in the memory cell array if the row enable signal RE is outputted from a below-mentioned internal pulse generator circuit 10.

An address circuit system comprises the above-described multiplexers 3A and 3B and the pre-decoders 5A and 5B and the row decoder 6. The address circuit system provides a first characteristic part of the semiconductor memory device in accordance with this embodiment. In the active mode, a single word line defined by the addresses MADDX1 and MADDX2 is selected. In the stand-by mode, four word lines defined by the address MADDX2 are selected in parallel.

The high level of the word line is defined by a boosted voltage supplied from a boost power source not illustrated.

A memory cell array 7 comprises a matrix array of memory cells (including a pair of a single capacitor and a single transistor) which include data storage capacitors similarly to the general-purpose DRAM, wherein word lines and bit lines run in row and column directions respectively, while the memory cells are positioned at crossing points of the word lines and the bit lines. In accordance with this embodiment, this memory cell array 7 is divided into four sub-blocks 7A~7D, provided that division of the memory cell array should not be limited to this example.

Even illustration is omitted from FIG. 1, the same number of the row decoders 6 are provided as the number of rows in each of the sub-blocks. Namely, a plurality of the row decoders 6 are provided for the number of the rows of each of the sub-blocks. One of the plural row decoders 6 is exclusively selected by the pre-decoder 5A, and the logic gates 6A~6D in each the row decoders 6 are selected by the pre-decoder 5B. The logic gates 6A~6D of the row decoder 6 are allocated for selecting the respective row (word line) in the sub-blocks 7A~7D. For example, if the logic gate 6A in the row decoder 6 as illustrated is to select a row in the sub-block 7A, then the logic gate 6A in the other row decoder not illustrated is to select the other row in the same sub-block 7A.

In the sub-blocks 7A~7D, sense amplifiers 70A~70D, column switches and pre-charge circuits are placed. The sense amplifiers 70A~70D are activated under the control of a sense amplifier enable signal SE outputted from a below-mentioned internal pulse generator circuit and amplify the data. Concretely, if the sense amplifier enable signal SE is in the high level, the sense amplifier amplifies the potential of the bit line and supplies the amplified potential onto a bus for read operation, while the sense amplifier stores write-data supplied through the bus into memory cells for write operation. This sense amplifier is used for recovery of the data once stored in the memory cells for refresh operation.

The sense amplifiers 70A~70D and those control system are the second characteristic of the semiconductor memory device in accordance with the present invention, in view that the current driving ability is suppressed smaller in the stand-by mode than in the active mode. Concretely, the sense amplifier is a latch-type amplifier which has a basic structure of a flip-flop which comprises two inverters cross-connected to each other. A single pair of stable nodes of the flip-flop is connected to a single pair of bit lines. In accordance with this embodiment, a current driving ability of the inverters which form the flip-flop in the amplifier is controlled depending upon the operation mode. The method of controlling the current driving ability includes a method of switching a current driving ability of the inverters forming the flip-flop, and another method of switching a current driving ability of another circuit system supplying a current to the inverters. In any methods, a plurality of transistors connected in parallel to each other are selectively made conductive to switch the current driving ability.

A refresh timer 8A is provided to measure a time interval of refreshes, and the refresh timer 8A outputs a basic clock signal CK0 to be used in the active mode and a refresh control signal REF4 to be used in the stand-by mode.

A refresh control circuit 8B is provided for controlling a series of refresh operations based on the address transition detecting signal SATD outputted from the above-described address transition detector circuit 2. For example, the refresh control circuit 8B starts the self-refresh operation if a passed time from the final external access request becomes beyond a predetermined refresh time. For this reason, the refresh timer 8A is reset to re-start the timing operation each time the positive pulse is outputted as the address transition detecting signal SATD.

The refresh control circuit 8B generates refresh control signals REFA and REFB for controlling the timings of the refresh operations. The refresh control signal REFA is a signal for controlling the refresh accompanying to the read/write operation upon an external access. If the refresh control signal REFA is in the high level, then the refresh operation is made in synchronizing with the transition of the address. The refresh control signal REFB is another signal to be used for starting the self-refresh operation in the stand-by mode and in the active mode. The refresh operation is started when the negative one-shot pulse is generated as the refresh control signal REFB.

A refresh address generator circuit 8C generates a refresh row address RADDX which selects the row (word line) of the memory cell for refresh operation. The refresh address generator circuit 8C includes a basic structure of counter. A selector 9 selects the refresh control signal REFB or the refresh control signal REF4, depending upon the operation mode. An internal pulse generator circuit 10 receives inputs of a signal selected by the selector 9 and the refresh control signal REF4, and the internal pulse generator circuit 10 generates a row enable signal RE, a sense amplifier enable signal SE, a pre-charge enable signal PE, and a column enable signal CE.

The row enable signal RE is a pulse signal which defines an operation timing of the row decoder 6. A pulse width of the pulse signal defines a time period of selecting the word line in the refresh operation. This row enable signal RE is generated by triggering any of the above-described refresh control signals REFA, REFB and REF4, depending upon the operation mode. The sense amplifier enable signal SE defines operation timings of the sense amplifiers 70A~70D. The pre-charge enable signal PE defines operation timings of pre-charge circuits (not illustrated) for the bit lines. The column enable signal CE defines an operation timing of the column decoder.

Another circuit system, which comprises the refresh timer 8A, the refresh control circuit 8B and the internal pulse generator circuit 10, is a third characteristic part of the semiconductor memory device of this embodiment. This circuit system realizes a function of starting the refresh operation in a refresh cycle which is extended four times in the stand-by mode, and another function of expanding the pulse width of the row enable signal RE which defines the period of time of selecting the word line.

Other than the above-described circuits, this semiconductor memory device is provided with still another circuit system of controlling read operation and write operation, yet another circuit system of generating a substrate voltage of the memory cell array, and further another circuit system of input and output from and to the outside.

Figure 2:
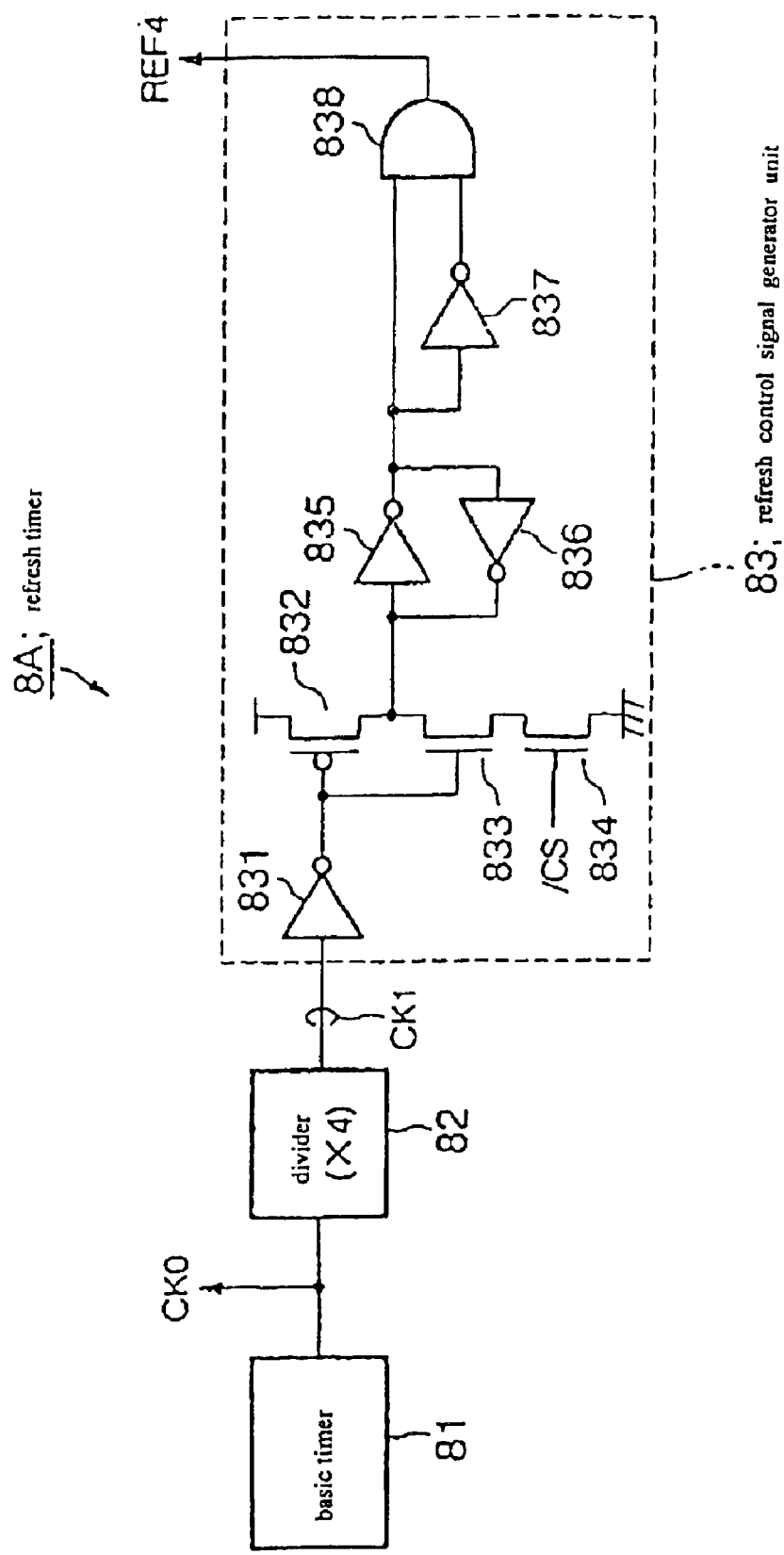
FIG. 2 is a block diagram illustrative of a configuration of a refresh timer in accordance with the first embodiment of the present invention.

FIG. 2 shows an example of the configuration of the above-described refresh timer 8A.

In this drawing, a basic timer 81 generates a basic clock signal CK0 providing a base for timing the refresh operation. A frequency divider 82 frequency-divides the basic clock signal CK0 and generates a block signal CK1 having a cycle longer by four times than that of the basic clock signal CK0. A refresh control signal generator unit 83 generates the refresh control signal REF4 by triggering a chip select signal/CS and the clock signal CK1.

The refresh control signal generator unit 83 comprises inverters 831, 835, 836 and 837, a p-type field effect transistor 832 and n-type field effect transistors 833 and 834 and a logic AND-gate 838. The inverter 831 inverts the clock signal CK1. The p-type field effect transistor 832 and the n-type field effect transistors 833 and 834 form a complex gate (no code) which functions as a logic NAND-gate. If the chip select signal/CS is in the high level, then this complex gate exhibits a function of an inverter which receives an inversion signal of the clock signal CK1 (output signal from the inverter 831). If the chip select signal/CS is in the high level, then this complex gate outputs the high level upon receipt of the inversion signal of the clock signal CK1.

The inverters 835 and 836 form a flip-flop which holds the output signal from the above-described complex gate. The inverter 835 receives the output signal from the complex gate and outputs an inversion signal of the received signal. The inverter 837 and the logic AND-gate form an edge detecting circuit for detecting a rising edge of the output signal from the inverter 835, and generates, as the refresh control signal REF4, a pulse signal with a pulse width depending upon a delay time of the inverter 837.

In accordance with the refresh timer 8A as configured above, the basic clock CK0 outputted from the basic timer 81 is converted by the frequency divider 82 into the clock signal CK1 with the cycle longer by four times than the basic clock CK0. If the chip select signal/CS is in the high level, then the complex gate, which comprises the p-type field effect transistor 832 and the n-type field effect transistors 833 and 834, exhibits a function of inverter, whereby the inversion signal of the clock signal CK1 is supplied to the edge detecting circuit (the inverter 837 and the logic AND-gate 838). This edge detecting circuit detects the rising edge of the clock signal CK1 and generates the refresh control signal REF4.

As a result, from this refresh timer 8A, obtained are the basic clock signal CK0 and the pulse signal of the refresh control signal REF4 generated at the frequency of one time for four cycles of the basic clock signal CK0.

Operations of the semiconductor memory device in accordance with this embodiment will be described with focusing into the refresh operation thereof.

This semiconductor memory device allows setting two kinds of refresh modes. The first mode is a self-refresh mode, wherein the refresh is automatically made according to the internal clock (for example, the refresh control signal REFB). The self-refresh mode of this embodiment is automatically made inside for holding the data stored in the memory cells independently from the operation modes such as the stand-by mode and the active mode and without need any external signal related thereto. This makes the user free from the consideration of the refresh similarly to the normal SRAM.

The second mode is a refresh mode accompanying to the read operation or the write operation in the read cycle or the write cycle, wherein the refresh is made in synchronizing with the address transition. In this embodiment, the following description will be made by focusing the former self-refresh mode. In the self-refresh mode, the selector 9 selects the refresh control signal REFB and supplies the selected one to the internal pulse generator circuit 10.

A. Operation in Read Mode:

Operations in the read mode as one kind of the active modes will be described with reference to the waveforms shown in FIG. 3.

Figure 3:
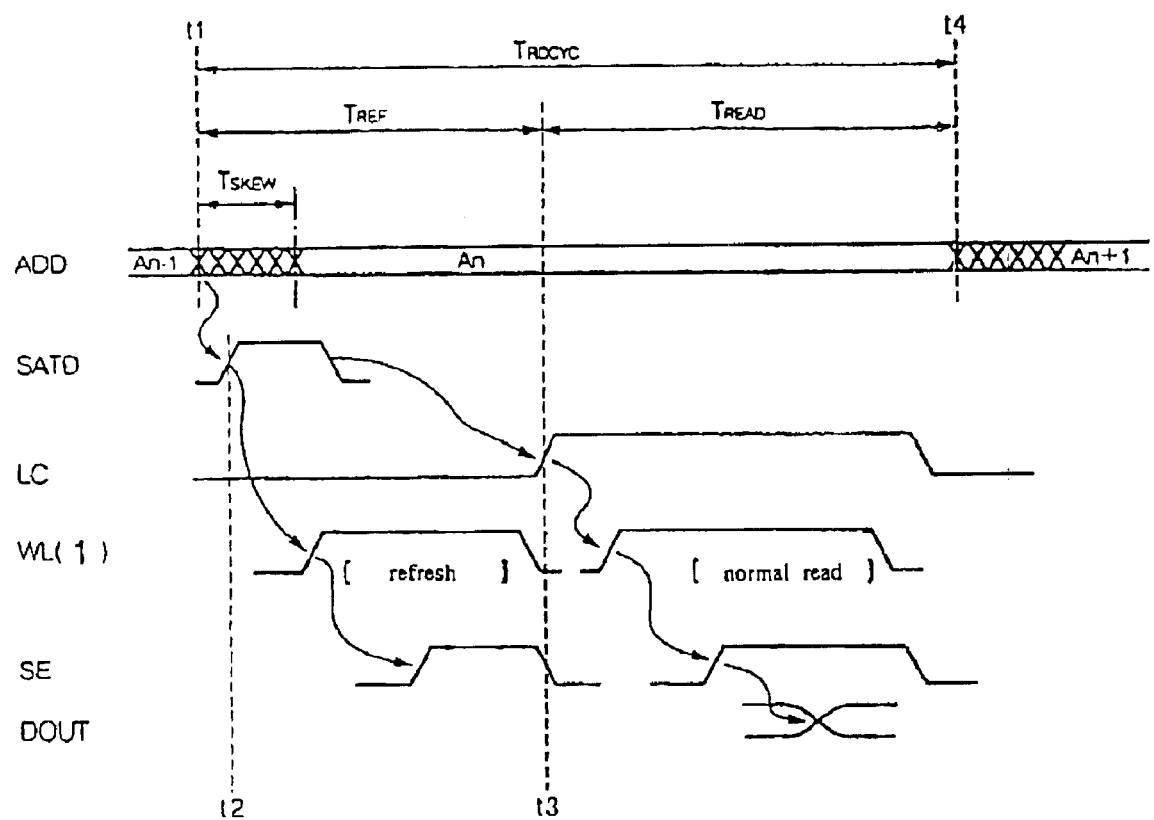
FIG. 3 is a timing chart illustrative of waveforms describing operations (in read mode) of the semiconductor memory device in accordance with the first embodiment of the present invention.

As shown in FIG. 3, at a time t1, the address ADD is transitioned from the current value "An−1" to another value "An", whereby a read cycle TRDCYC is started. The address ADD as transitioned at the time t1 is fetched by the address input system 1. After a skew time period TSKEW has passed, then the value "An" of the address ADD is defined.

At this time, the latch signal LC is in the low level, while the address input system 1 is in a through-state. Accordingly, the address ADD fetched into the address input system 1 from the outside is then outputted sequentially as the internal address LADD. It should be noted that the multiplexers 3A and 3B have not yet been prepared to receive the internal addresses LADDX1 and LADDX2 respectively, for which reason the internal addresses LADDX1 and LADDX2 remain in non-entry into the multiplexers 3A and 3B.

On the other hand, at the time t1, the address ADD is transitioned, while the internal address LADD is also transitioned, whereby the address transition detector circuit 2 detects this transition of the internal address LADD and generates the address transition detecting signal SAID. The refresh operation time period TREF is defined from the time t1, when the address ADD is transitioned, to the time t3, when the below-mentioned read operation is started. In the refresh operation time period TREF, the refresh control circuit 8B receives the address transition detecting signal SATD, and starts the refresh operation, and the refresh address generator circuit 8C generates the refresh address RADD. The refresh control circuit 8B generates the refresh control signal REFB, which define the timing of the self-refresh, and supplies the refresh control signal REFB to the selector 9.

In this embodiment, the cycle of the basic clock signal CK0 is so set that the single refresh address RADD is generated in the minimum read cycle TRDCYC, whereby even if the read operations are repeated in the most strict cycle, then in each cycle, a new refresh address is generated to start the refresh operation. Notwithstanding, it is also possible that the same refresh cycle is generated for a plurality of read cycles, and also setting the cycle of generating the refresh address is optional as long as the refresh can be made.

As described above, the selector 9 has been set to select the refresh control signal REFB. Namely, the refresh control signal REFB is supplied through the selector 9 to the multiplexers 3A and 3B and the internal pulse generator circuit 10. The multiplexers 3A and 3B receive an input of the refresh control signal REFB, and select the refresh addresses RADDX2 and RADDX1 respectively, and output those selected ones as the internal addresses MADDX2 and MADDX1. The internal address MADDX2 is then supplied to the pre-decoder 5A, while the internal address MADDX12 is then supplied through the gate circuit 4 to the pre-decoder 5B.

In parallel to the above-described operations of the multiplexers 3A and 3B, the internal pulse generator circuit 10 outputs the row enable signal RE at a timing defined by the refresh control signal REFB selected by the selector 9. The pre-decoders 5A and 5B receive the row enable signal RE and pre-decode the internal addresses MADDX1 and MADDX2 supplied from the multiplexers. Pre-decoded signals are outputted from the pre-decoders 5A and 5B and supplied to the row decoder 6 at a timing of activating the row enable signal for a time period corresponding to the pulse width of the row enable signal RE.

The row decoder 6 decodes the signals outputted from the pre-decoders 5A and 5B, and selectively drives a single word line WL in all the word lines belonging to the sub-blocks 7A~7D. This word line WL is selected at a predetermined timing defined by a start edge of the address transition detecting signal SATD, whereby data stored in a memory cell connected to the selected word line appears on the bit line. At a predetermined timing from selection of the word line, the sense amplifier enable signal SE is activated, whereby the data signals on the bit lines are amplified by the sense amplifiers 70A~70D and then re-stored into the memory cells.

The refresh operation in the read cycle TRDCYC with designating the value "An" for the address ADD has been completed. In accordance with the above-described refresh operation in the read mode, the pulse width of the row enable signal RE defining the word line selecting time period is so limited as not to disturb the subsequent read operation to the refresh operation. For this reason, the current driving ability of the sense amplifier used for re-storing the once-read data signal again into the memory cell is properly set so as to ensure the refresh in the word line selecting time period defined by the row enable signal RE with the limited pulse width.

Following to the above-described refresh operation, the read operation is made. Namely, the latch control circuit not illustrated receives an input of the address transition detecting signal SATD, and activates the latch signal LC at the time t3 after the refresh operation has been made. This latch signal is activated at a predetermined timing of the end edge of the address transition detecting signal SAID. A read operation time period TREAD is defined from the activation of the latch signal LC to a time t4 when the next cycle starts. In this read operation time period TREAD, the address input system 1 latches the address ADD based on the latch signal LC, and then outputs the same as the internal address LADD. Latching the address may prevent any malfunction due to the operation noises.

The row addresses included in the internal address LADD are supplied as the internal row addresses LADDX1 and LADDX2 to the multiplexers 3A and 3B, while the column addresses included therein is supplied as the internal column address LADDY top a column decoder not illustrated. The multiplexers 3A and 2B select the internal addresses LADDX2 and LADDX1 respectively, and then supply the selected ones to the pre-decoders 5A and 5B, respectively. Similarly to the above-described refresh operation, the row decoder 6 exclusively selects the word line, whereby the data stored in the memory cells connected to this word line are read and transferred onto the bit lines for subsequent amplification by the sense amplifiers. In accordance with this read operation, the amplified data signals are then re-stored into the memory cells and also supplied to the outside as data DATA through a read out circuit system not illustrated.

The read operation in the read cycle TRDCYC with designating the value "An" for the address ADD has been completed.

B. Operation in the Stand-By Mode:

Operations in the stand-by mode will be described. In the stand-by mode, the circuit is controlled in a state different in the following points of view from the state of the refresh operation in the active mode.

First, the circuit is so set as to extend the refresh cycle and the word line selecting time period. Concretely, the circuit state of the selector 9 is so set as to select the refresh control signal REF4. The internal pulse generator circuit 10 is also so set as to generate a row enable signal RE with the expanded pulse width based on the refresh control signal REF4.

Second, the circuit state is also set as to select four word lines in parallel. Concretely, the circuit state of the gate circuit 4 is so set that the internal address MADDX1 is degenerated and the pre-decoder 5B concurrently selects the logic AND-gates 6A~6D.

Third, the circuit states of the sense amplifiers 70A~70D are so set as to suppress those current driving abilities. Concretely, the current driving abilities of the sense amplifiers 70A~70D are so set smaller as possible, as long as a peak current in concurrently selecting four word lines is lower than another peak current in the read cycle, and the refresh is normally made in a below-mentioned refresh cycle TRFCYC.

Figure 4:
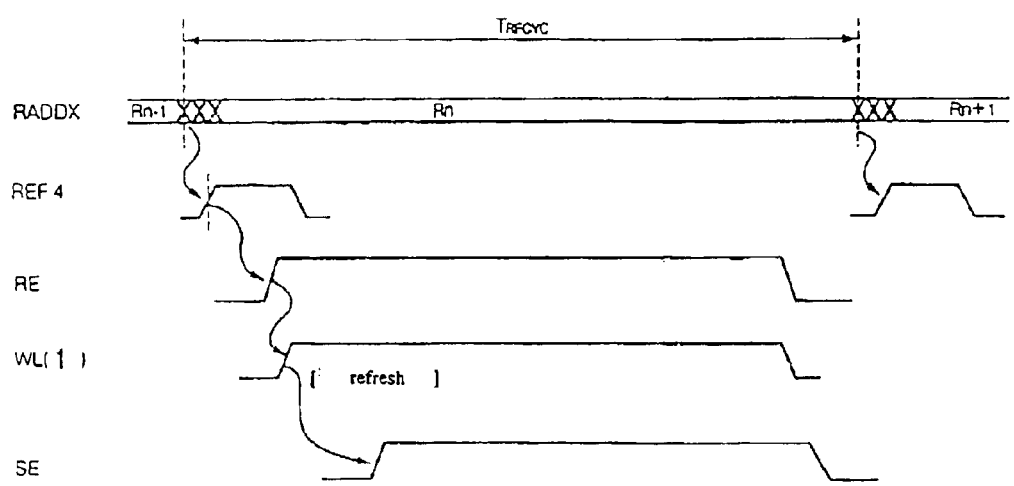
FIG. 4 is a timing chart illustrative of waveforms describing operations (in stand-by mode) of the semiconductor memory device in accordance with the first embodiment of the present invention.

Detailed descriptions will be made with reference to the waveforms of FIG. 4, provided that the self-refresh operation is made in the stand-by mode which has been previously set.

In the stand-by mode, the circuit systems such as the address input system 1 which are not related to the refresh operation are controlled to be inactivated, thereby suppressing any further current consumption accompanying to the other operations than the refresh operation. The refresh control circuit 8B controls the refresh address generator circuit 8C to generate the refresh address RADDX in the cycle of the basic clock signal CK0 generated by the refresh timer 8A. Namely, the refresh address RADDX is generated similarly to the above-described read cycle.

The refresh address generator circuit 8C generates the refresh address RADDX in the same cycle as the refresh operation in the above-described read cycle. In the stand-by mode, four word lines are selected in parallel, for which reason the refresh address RADDX1 of the lower significant bits for selecting one of the four word lines have no sense. Accordingly, only the refresh address RADDX2 of the higher significant bits effective as the refresh address RADDX is generated at a cycle TRFCYC which is longer by four times than the above-described read cycle TRDCYC. In the example shown in FIG. 4, values "Rn−1", "Rn", and "Rn+1" are sequentially generated for the refresh address RADDX (RADDX2). This refresh address RADDX is supplied to the multiplexer.

On the other hand, the refresh timer 8A generates the basic clock signal CK0 and supplies the same to the above-described refresh control circuit 8B. The refresh timer 8A also generates the refresh control signal REF4 with the cycle TRFCYC which is longer by four times than the basic clock signal CK0, and supplies the refresh control signal REF4 to the internal pulse generator circuit 10. The internal pulse generator circuit 10 outputs the row enable signal RE with the expanded pulse width, based on the refresh control signal REF4. This pulse width is so set long as possible, as long as the refresh operation in the next cycle generating the value "Rn+1" for the refresh address RADDX is not disturbed.

The pre-decoder 5A pre-decodes the internal address MADDX2 (RADDX2) based on the row enable signal RE with the expanded pulse width, and then supplies the same to the row decoder 6. Upon receipt of this signal, the row decoder 6 selects and drives the four word lines designated by the internal address MADDX2 (RADDX2). Subsequently, a data signal is read out of the memory cell and transferred onto the bit line, whereby the sense amplifier is activated at a predetermined timing, to amplify the data signal on the bit line and then re-store the amplified signal into the memory cell. As a result, the refresh operation to the four word lines for four rows in the single cycle has been made in the stand-by mode. As long as the stand-by mode continues, the refresh cycles TRFCYC are continuously executed in the semiconductor memory device for self-refresh to a unit of the plural word lines.

Figure 5:
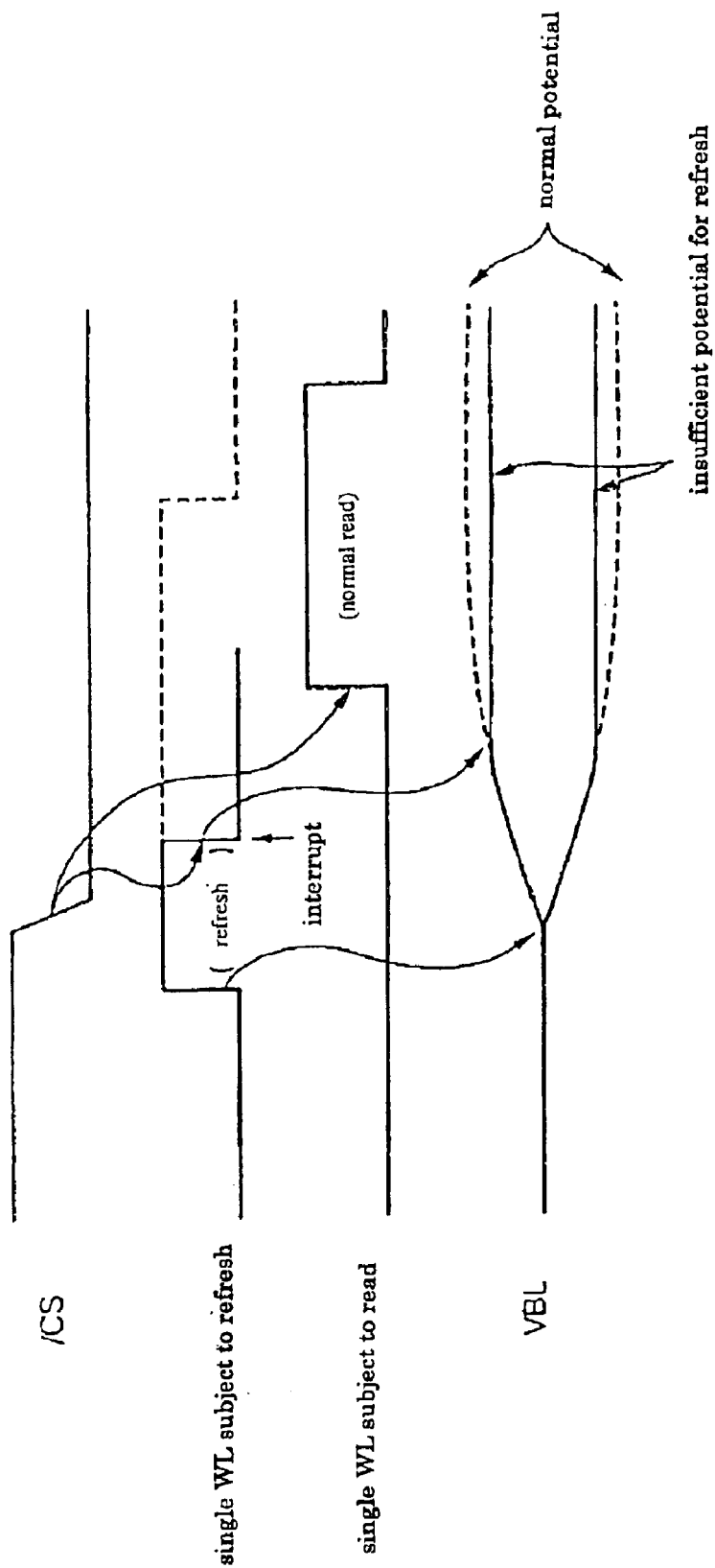
FIG. 5 is a timing chart illustrative of waveforms describing operations (interruption of a refresh operation when the stand-by mode is switched to the active mode) of the semiconductor memory device in accordance with the first embodiment of the present invention.

C. Operation When the Stand-By Mode is Switched to the Active Mode:

Operations when the stand-by mode is switched to the read mode as one kind of the active modes will subsequently be described with reference to FIG. 5.

As described above, in the stand-by mode, the self-refresh operation is periodically executed at the refresh cycle TRFCYC. The semiconductor memory device is the non-synchronous memory, for which reason four word lines WL designated by a refresh address R1 are selected. It is possible that as shown in FIG. 5, the chip select signal/CS becomes low level during the refresh operation, whereby the operation mode is switched from the stand-by mode into the read mode. In this case, the selected four word lines WL are forcibly placed into the non-selected state, so that in a subsequent read mode, a single word line WL is again selected based on the address ADD externally designated, whereby data are read out of the memory cells connected to this word line WL.

By the way, if the selected four word lines WL are forcibly placed into the non-selected state, while the refresh operation is discontinued, then the sense amplifier having amplified the data signal are inactivated, even a potential VBL of the data signals, which should be re-stored into the memory cells connected to those word line WL, have not yet reached a normal potential. Accordingly, the refresh operation is discontinued, even refreshing data of the memory cells connected to the word liens is insufficient. This allows disappearance of the data.

Figure 6:
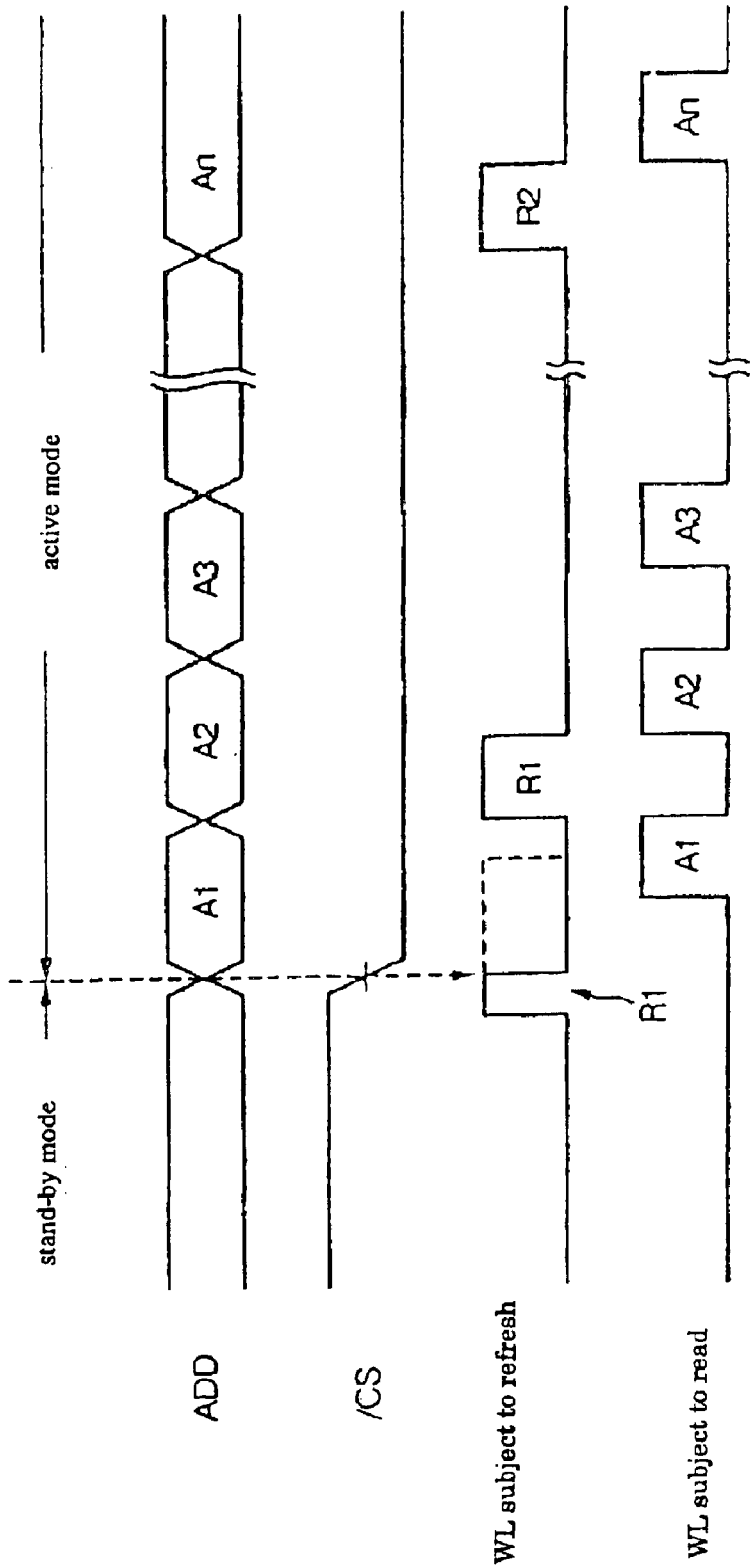
FIG. 6 is a timing chart illustrative of waveforms describing operations (countermeasure to the interruption of the refresh operation) of the semiconductor memory device in accordance with the first embodiment of the present invention.

To countermeasure this problem, if the operation mode is switched to the read mode during the refresh operation, then as shown in FIG. 6, in the second read cycle of the read mode or in the cycle designating an address A2 as the address ADD, the refresh operation is made again to the four word lines WL designated by the address R1 (row address) for which the past refresh operation has been interrupted. Even if the refresh operation is interrupted in the stand-by mode, then the potential of the data signal in the memory cells is recovered to the normal potential, thereby avoiding any disappearance of the data.

D. Operation When the Active Mode is Switched to the Stand-By Mode:

Operations when the operation mode is switched from the read mode as one kind of the active modes into the stand-by mode will be described with reference to the waveforms of FIG. 7.

Figure 7:
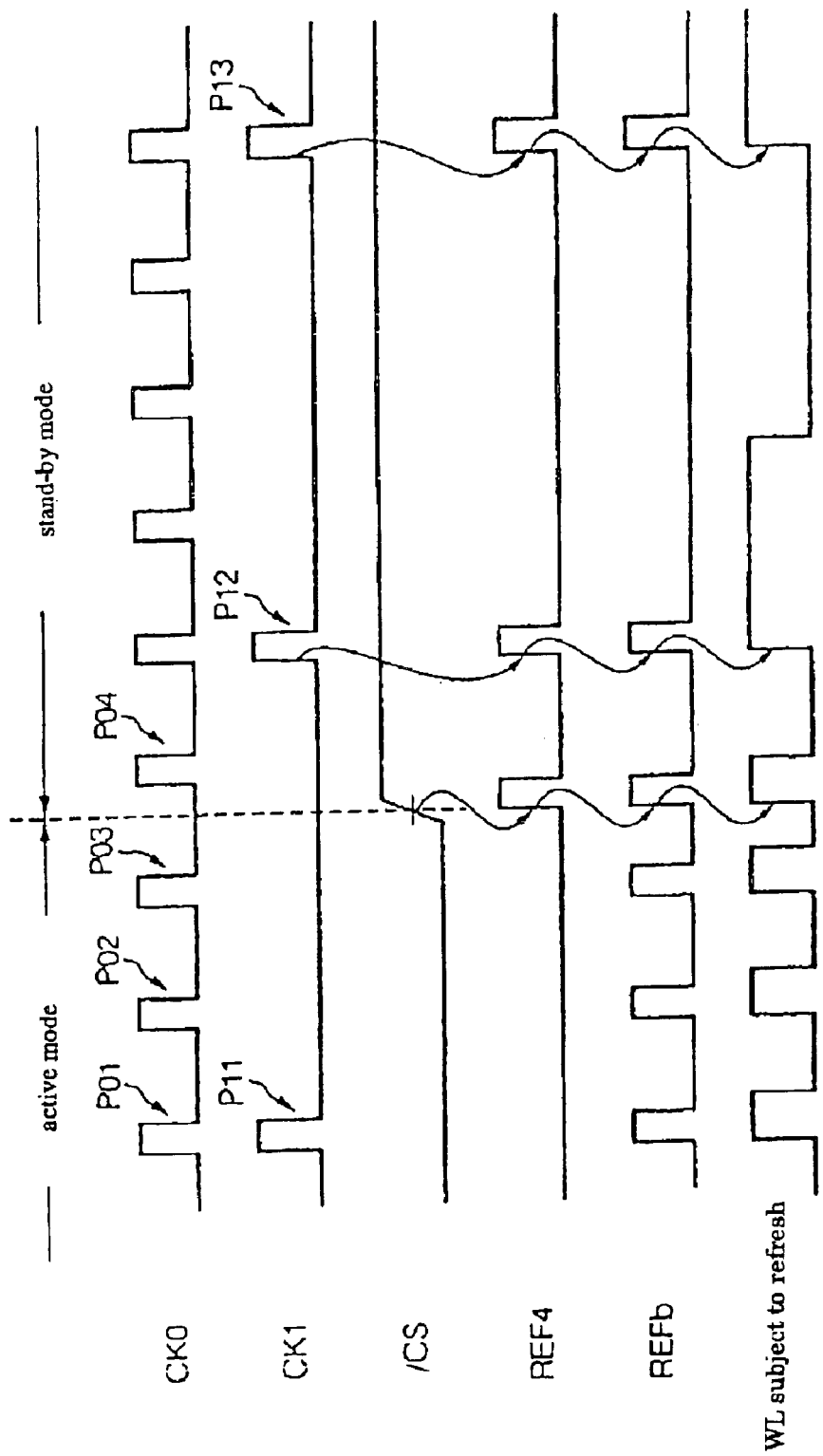
FIG. 7 is a timing chart illustrative of waveforms describing operations (unexecution of the refresh operation when the active mode is switched to the stand-by mode) of the semiconductor memory device in accordance with the first embodiment of the present invention.

In FIG. 7, four word lines, which are subject to the refresh operation based on pulse signals P01~P04 of the basic clock signal CK0 in the active mode, correspond to four word lines, which should be subject to the refresh based on a single pulse signal P11 of the clock signal CK1 in the stand-by mode.

As shown in FIG. 7, the chip select signal/CS is transitioned from the low level to the high level before the pulse signal P04, whereby the operation mode is switched to the stand-by mode. The refresh operation based on the refresh control signal is executed at a timing of a pulse signal P12 late-generated after the pulse signal P04. In order to avoid a problem with no refresh operation being made based on the pulse signal P04, the refresh timer 8A detects that the operation mode has been switched from the active mode and the stand-by mode, and additionally generates the refresh control signal REF4 for conducting the refresh in the stand-by mode to the word lines which should be subject to the refresh in the active mode.

Operations of the refresh timer 8A when the operation mode is switched from the active mode to the stand-by mode will subsequently be described. In FIG. 2, if the operation mode is the active mode, then the n-type field effect transistor 834 with a gate receiving the chip select signal/CS turns OFF, while the high level appears on drains of the p-type field effect transistor 832 and the n-type field effect transistor 833 having gates which receive the inversion signal of the clock signal CK1 periodically outputted. This signal level will be held by the flip-flop which comprises the inverters 835 and 836. The inverter 835 supplies the low level to the logic AND-gate 838. Accordingly, if the operation mode is the active mode, then the refresh control signal REF4 outputted from the logic AND-gate 838 is fixed at the low level.

In the time period when the clock signal CK1 remains in the low level, switching the chip select signal/CS into the high level causes that the input of the inverter 835 is driven into the low level through the n-type field effect transistors 833 and 834. As a result, if the output signal from the logic AND-gate 838 is transitioned from the low level to the high level, then the edge detecting circuit, which comprises the logic AND-gate 838 and the inverter 837, detects the rising edge of the output signal from the inverter 835, and then the logic AND-gate generates, as the refresh control signal REF4, a pulse signal with a pulse width which corresponds to a delay time of the inverter 837.

This refresh control signal REF4 is supplied as a refresh control signal REFb through the selector 9 to the internal pulse generator circuit 10, resulting in an output of the row enable signal RE. The word lines WL, which should be refreshed based on the pulse signal P04 in the active mode, are selected in the stand-by mode for refresh operation. Accordingly, even if the operation mode is switched at an optional time from the active mode to the stand-by mode, then no word line is subjected to no refresh operation. After the operation mode is switched to the stand-by mode and the refresh is made to the word lines which should be subject to the refresh in the active mode, then the refresh operation starts periodically at the cycle longer by four times as described above.

In accordance with the first embodiment described above, the current driving ability of the sense amplifier is suppressed for the refresh operation in the stand-by mode, for which reason it takes a longer time to amplify the data signal. Notwithstanding, the word line selecting time period is extended, for which reason the signal level of the data stored in the memory cells is amplified to the normal level. Thus, the complete refresh of the data is possible. Further, the four word lines are selected in parallel for refresh operation, for which reason even if the time period of selecting each word line, the refresh operation to each word line can be executed in a cycle equivalent to the read cycle. Accordingly, in the same memory cell, the next refresh operation can be made within a time period which satisfies the data retention characteristic.

In the stand-by mode, the circuit system related to the refresh operation is operated in the cycle longer by four times than the read cycle, whereby the frequency of the operation of this circuit system is reduced and thus the current comsumption caused by the refresh operation is suppressed.

(Second Embodiment)

The second embodiment of the present invention will be described.

In the above-described first embodiment, switch of the operation mode from the active mode to the stand-by mode is detected to additionally execute the refresh in the stand-by mode. In accordance with this second embodiment, even if the operation mode is switched to the stand-by mode, after the refresh operation is completed to the group of the word lines, which should be refreshed in the active mode, then the four word lines are selected in parallel for refresh operation.

Figure 8:
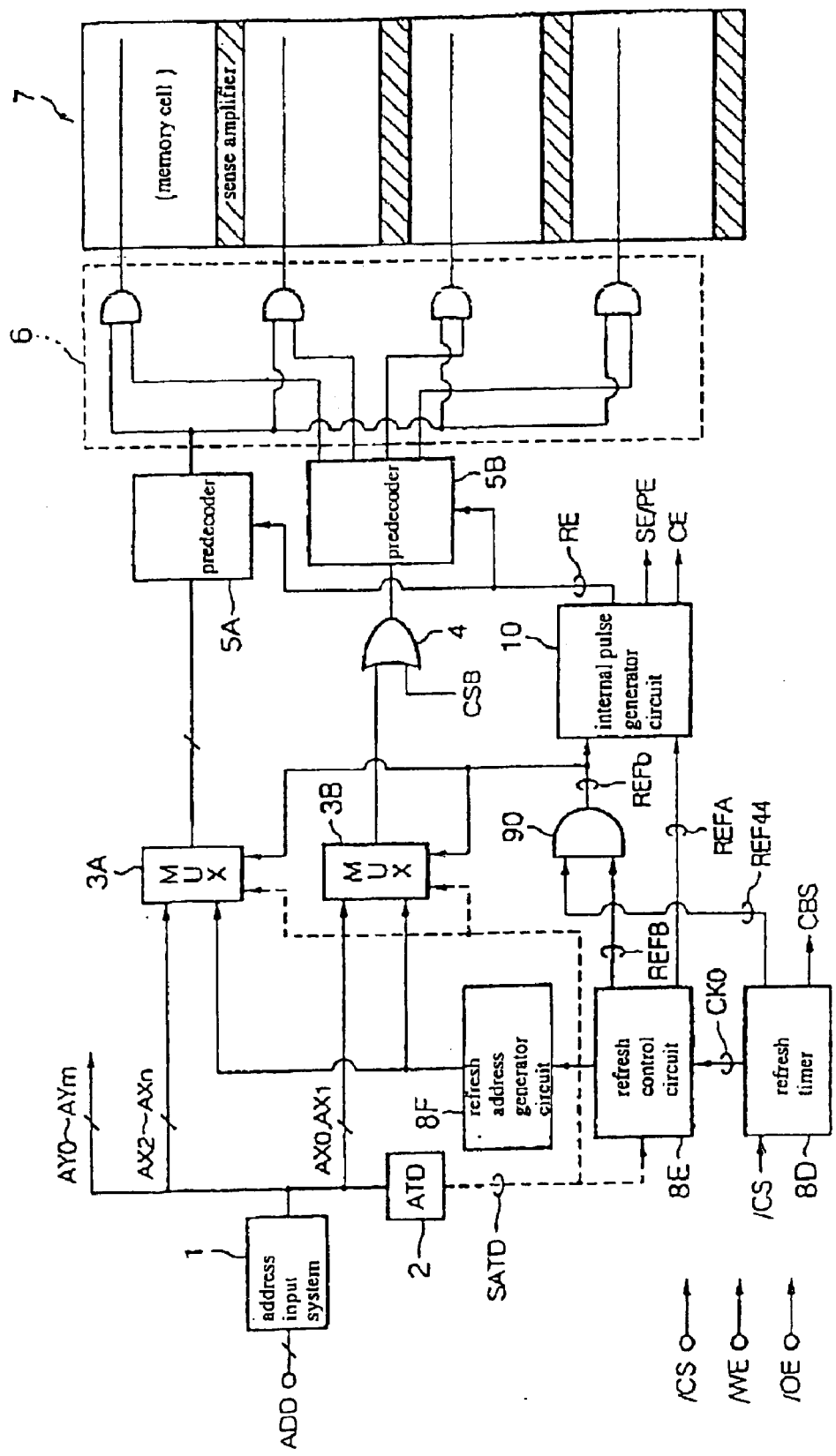
FIG. 8 is a block diagram illustrative of a configuration of a semiconductor memory device in accordance with a second embodiment of the present invention.

FIG. 8 shows the configuration of the semiconductor memory device of this second embodiment. This semiconductor memory device is different in configuration from the configuration shown in FIG. 1 in the first embodiment in view that a logic gate 90 is provided instead of the selector 90, and a refresh timer 8D is provided instead of the refresh timer 8A, and a refresh control circuit 8E is provided instead of the refresh control circuit 8B. The refresh timer 8D has a function of latching the chip select signal/CS. The refresh control circuit 8E has a function of fixing the refresh control signal REFB at the high level in the stand-by mode. Other configuration is the same as shown in FIG. 1.

Figure 9:
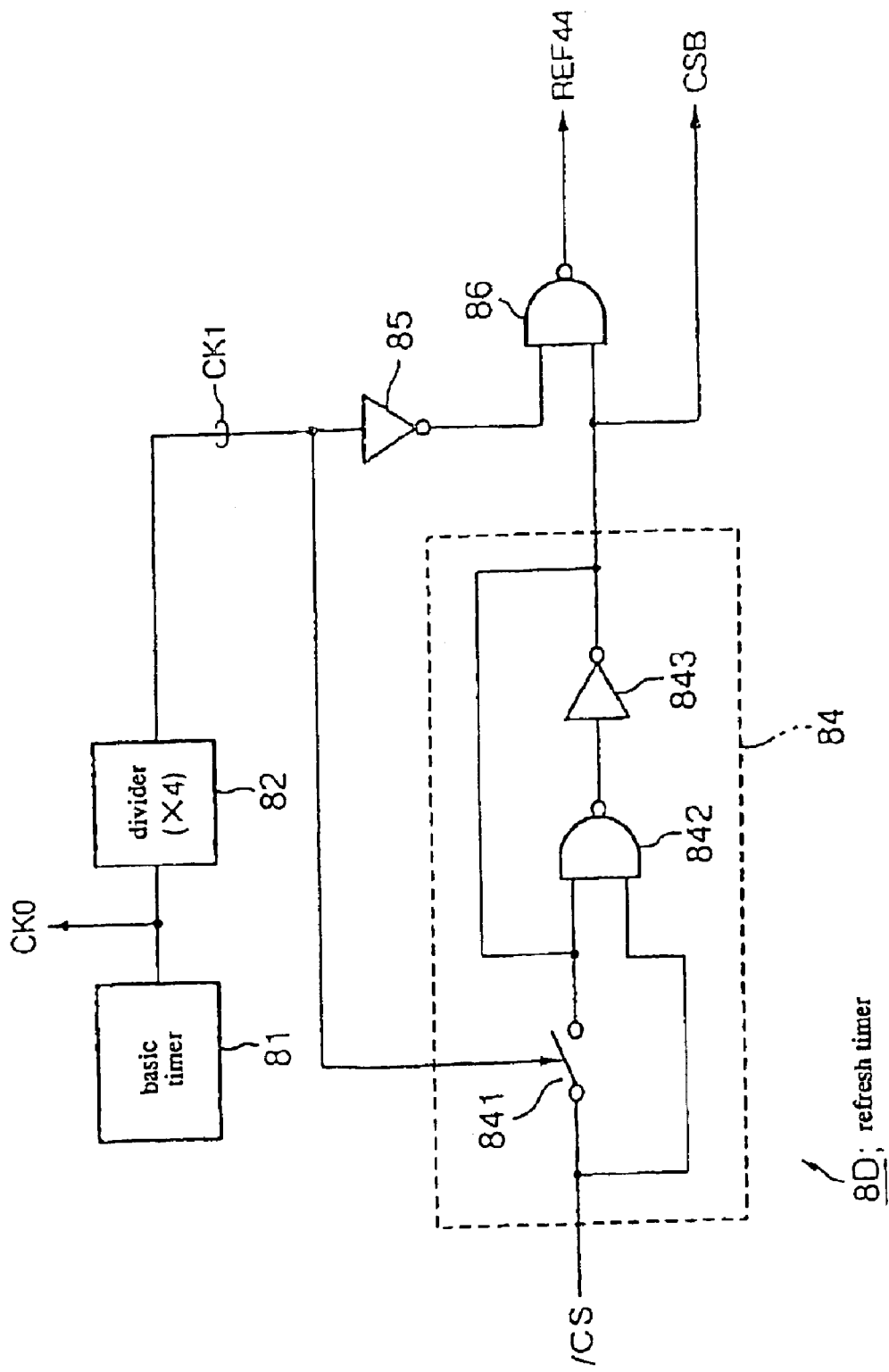
FIG. 9 is a block diagram illustrative of a configuration of a refresh timer in accordance with the second embodiment of the present invention.

FIG. 9 shows a configuration of the refresh timer 8D. In this drawing, common elements are assigned with the same reference numbers with reference to the refresh timer 8A shown in FIG. 2 in the first embodiment.

In this drawing, a latch circuit 84 is provided for latching the chip select signal/CS until the clock signal CK1 becomes the next high level after the clock signal CK1 has become the low level. The latch circuit 84 comprises a switch 841, a logic NAND-gate 842 and an inverter 843. The chip select signal/CS is supplied through the switch 841 to one input of the logic NAND-gate 842, while the chip select signal/CS is supplied directly to another input of the logic NAND-gate 842.

An output of the logic NAND-gate 842 is connected to an input of the inverter 843. An output of this inverter 843 is connected to one input (connected with the switch 841) of the logic NAND-gate 842. A signal appearing at the output of the refresh timer 84 is a signal CSB obtained by latching the chip select signal/CS. A logic NOR-gate 86 is supplied with a signal obtained by inverting the clock signal CK1 by the inverter 85 and the signal CSB outputted from the refresh timer 8D. An output signal from the logic NOR-gate 86 is a refresh control signal REF44.

Figure 10:
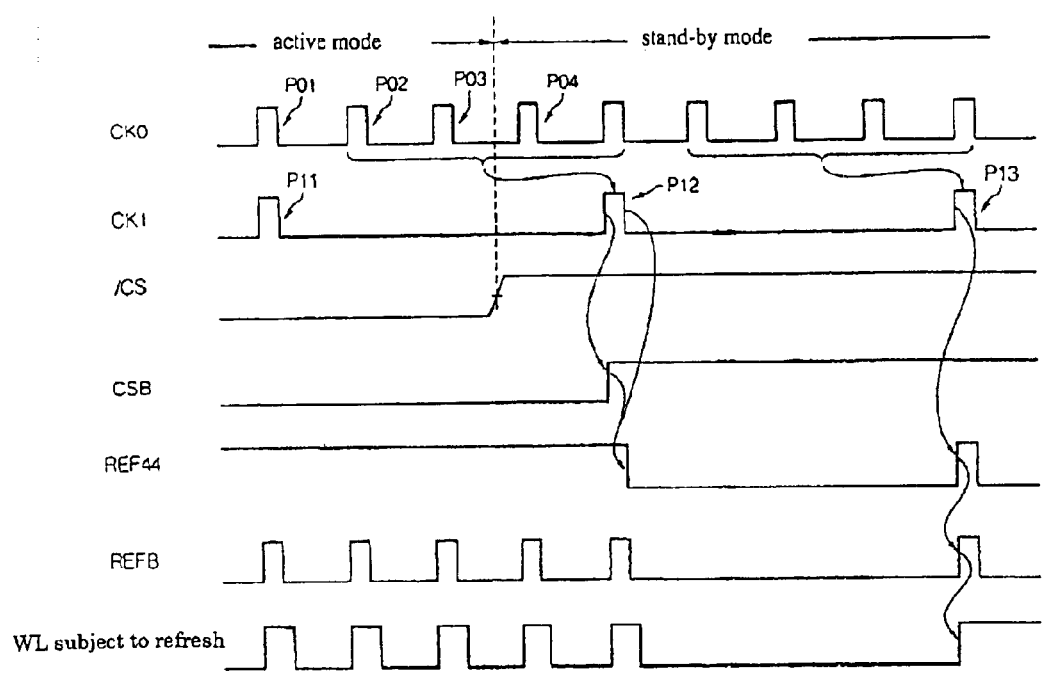
FIG. 10 is a timing chart illustrative of waveforms describing operations (interruption of a refresh operation when the active mode is switched to the stand-by mode) of the semiconductor memory device in accordance with the first embodiment of the present invention.

Refresh operations of this second embodiment will be described with reference to the waveforms of FIG. 10.

In the active mode, the refresh control signal REFB is generated based on the basic clock signal CK. A word line is selected based on this refresh control signal REFB for refresh operation. In this case, in the refresh timer 8D shown in FIG. 9, the chip select signal/CS is in the low level, for which reason independently from the state of the switch 841, the logic NAND-gate 842 outputs the high level. The inverter 843 receives the high level and supplies the low level to one input of the logic NAND-gate 842. This low level is then supplied as the signal CSB to the gate circuit 4. This gate circuit 4 supplies the pre-decoder 5B with the internal address selected by the multiplexer 3B. As a result, only a single word line designated by the internally generated refresh address RADD is selected for refresh operation.

If the chip select signal/CS is transitioned to the high level before the above-described pulse signal P04 whereby the operation mode is switched from the active mode to the stand-by mode, then the high level is supplied to another input (input supplied directly with the chip select signal/CS) of the logic NAND-gate 842 which forms the switch 841 shown in FIG. 9. At this time, if the switch 841 is opened, the low level is retained at the input (connected with the switch 841) of the NAND-gate 842. For this reason, the signal CSB is maintained at the signal level in case that the chip select signal/CS is in the low level. The gate circuit 4 receiving it remains in the current state.

If the signal CSB is maintained in the low level, then the refresh control signal REF44 outputted from a logic NAND-gate 86 receiving this signal is also maintained at the high level. A logic AND-gate 90 receiving this signal outputs the refresh control signal REFB which had been outputted as the refresh control signal REFb from the refresh control circuit 8E. In this case, the past refresh operation in the active mode will be continued.

After the refresh operation based on the basic clock signal CK has been completed, then the switch 841 becomes closed, whereby the high level of the chip select signal/CS is supplied to the two inputs of the NAND-gate 842, and the signal CSB becomes the high level. The gate circuit 4 receives this signal CSB and degenerates its output signal so as to select four word lines in parallel. The logic NAND-gate 86 forming the refresh timer 8D outputs the refresh control signal REF44 with the same cycle as the clock signal CK1 which has the cycle longer by four times than the basic clock signal CK0. After the pulse signal P04 of the basic clock signal CK1, and from the pulse signal P12 of the clock signal CK1, the refresh operation is executed similarly to the above-described first embodiment.

The refresh operation when the operation mode is switched from the active mode into the stand-by mode has been described above.

In accordance with this second embodiment, only the word line, which should be subject to the refresh in the active mode, is refreshed in the stand-by mode, whereby no word line is excessively subject to the refresh. Accordingly, it is possible to further effectively reduce the current consumption.

(Third Embodiment)

In this third embodiment, operations of driving the word lines will be described when the operation mode is switched during the refresh operation, and the refresh operation is thus interrupted. In the refresh operation, the word line is selected so that data in the memory cells are read out and transferred onto the bit lines for subsequent amplification by the sense amplifiers and the amplified data are then re-stored in the memory cells. It takes a time from selecting the word line until a potential difference, which can be amplified by the sense amplifier, appears on the bit line. Activation of the sense amplifier is made after a predetermined time has passed from selecting the word line.

Accordingly, it is temporary caused that an internal node of the memory cell is electrically connected to the bit line without activation of the sense amplifier. In this state, a charge accumulated as a datum in the memory cell is consumed to charge and discharge the bit line. If the refresh operation is interrupted even the sense amplifier has not yet been activated, then a datum of the memory cell is disturbed. In this embodiment, even if the refresh operation is interrupted, then the selecting state of the word line is maintained until the sense amplifier becomes operated.

Figure 11:
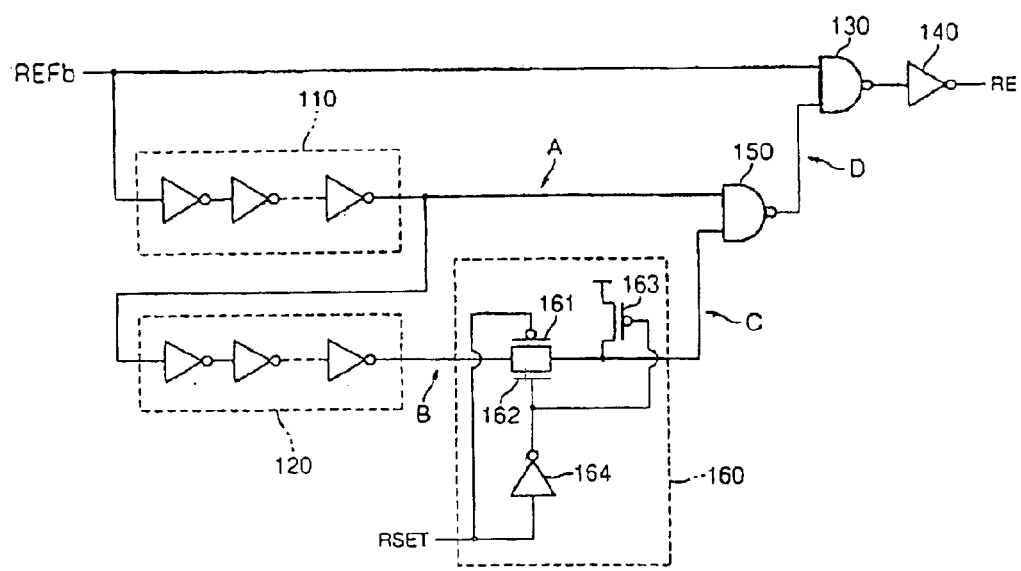
FIG. 11 is a block diagram illustrative of a configuration of a pulse generator circuit in accordance with the second embodiment of the present invention.

FIG. 11 shows a circuit for the above-purpose. The circuit shown in FIG. 11 is a pulse generator circuit integrated in the above-described internal pulse generator circuit 10. The pulse generator circuit receives an input of the refresh control signal REFb and then outputs the row enable signal RE. In this drawing, a delay circuit 110 comprises an inverter chain, and has a delay time td1 which corresponds to a time period defined from selecting the word line to the sense amplifier is activated. A delay circuit 120 is to obtain a delay time td2 corresponding to the word line selecting time which is inherently needed in cooperation with the above-described delay circuit 110. An output signal from the delay circuit 120 is inputted into a gate circuit 160.

The gate circuit 160 comprises a transfer gate, an inverter 164 and a p-type field effect transistor 163, wherein the transfer gate further comprises a p-type field effect transistor 161 and an n-type field effect transistor 162. If a signal RSET is in the low level, then the gate circuit 160 pass through the output signal from the delay circuit 120. If the signal RSET is in the high level, then the gate circuit 160 outputs the high level. This signal RSET is a signal activated when the refresh operation is finished or interrupted. An output signal from the above-described delay circuit 110 and another output signal from the gate circuit 160 are inputted into a logic NAND-gate 150. An output signal from this logic NAND-gate 150 and a refresh control signal REFb are inputted into a logic NAND-gate 130. An output of the logic NAND-gate 130 is connected to an input of an inverter 140. An output signal of this inverter 140 is the row enable signal RE.

Operations of the pulse generator circuit shown in FIG. 11 will be described with reference to waveforms shown in FIGS. 12 through 15.

Figure 12:
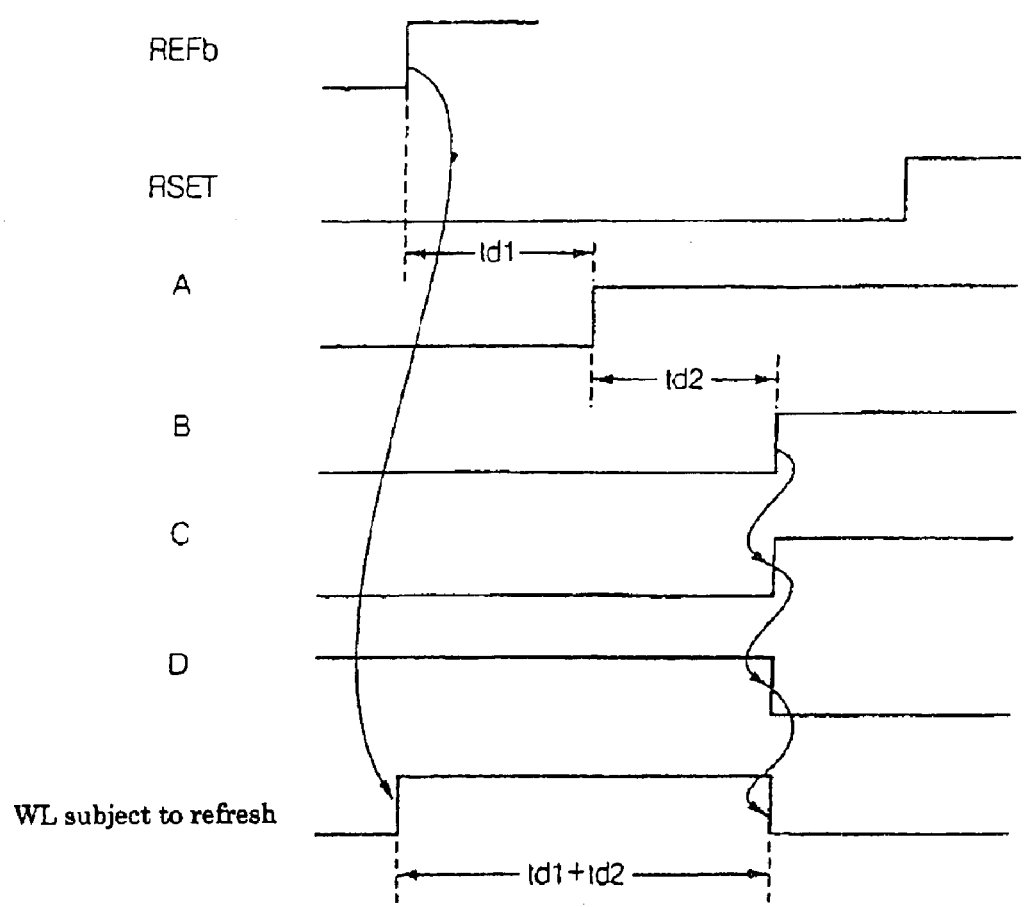
FIG. 12 is a timing chart illustrative of waveforms describing operations of the pulse generator circuit (in case of a maximum pulse width) in accordance with the second embodiment of the present invention.

With reference to FIG. 12, operations will be described when the refresh operation is interrupted after a time (td1+td2) has passed from selecting the word line. In this case, if the refresh control signal REFb is transitioned from the low level to the high level, then the word line is selected and becomes the high level. An output signal A from the delay circuit 110 having received the refresh control signal REFb becomes the high level after the time td1 has passed.

The output signal from the delay circuit 110 is inputted into the delay circuit 120. An output from the delay circuit 120 becomes the high level after the time (td1+td2) has passed from the transition to the high level of the refresh control signal REFb. A logic NAND-gate 150 receives, through the gate circuit 160, the output signal from the delay circuit 120, and then the logic NAND-gate 150 outputs a signal D of the low level. A logic NAND-gate 130 outputs the high level at a timing defined by the output signal B from the delay circuit 120. Accordingly, the row enable signal RE becomes the low level at a timing of a signal which has been transferred through the delay circuit 110, the delay circuit 120, the gate circuit 160, and the logic NAND-gate 150. In this case, thus the time period of selecting the word line corresponds to the delay time of the delay circuits 110 and 120.

Figure 13:
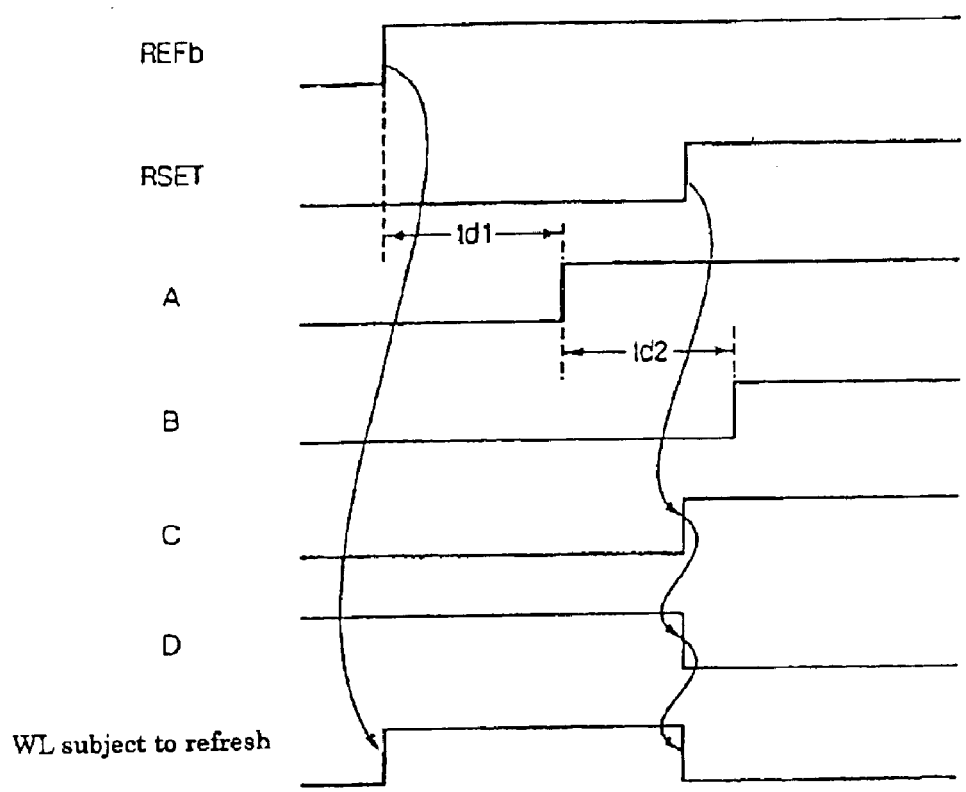
FIG. 13 is a timing chart illustrative of waveforms describing operations of the pulse generator circuit (wherein the pulse width depends on the timing of the interruption of the refresh operation) in accordance with the second embodiment of the present invention.

Operations will be described with reference to FIG. 13 when the refresh operation is interrupted after the time td1 has passed from selecting the word line even the time (td1+td2) has not yet passed. In this case, the signal C is transitioned to the high level after the signal A has been transitioned to the high level. For this reason, the output signal D from the logic NAND-gate 150 is transitioned to the low level at the timing of the signal C. The timing of this signal C depends on the signal RSET. Thus, the signal D depends upon the signal RSET. The row enable signal RE also depends upon the low level at the timing of the signal RSET. In this case, therefore, the time period of selecting the word line WL depends on the timing of the signal RSET.

Figure 14:
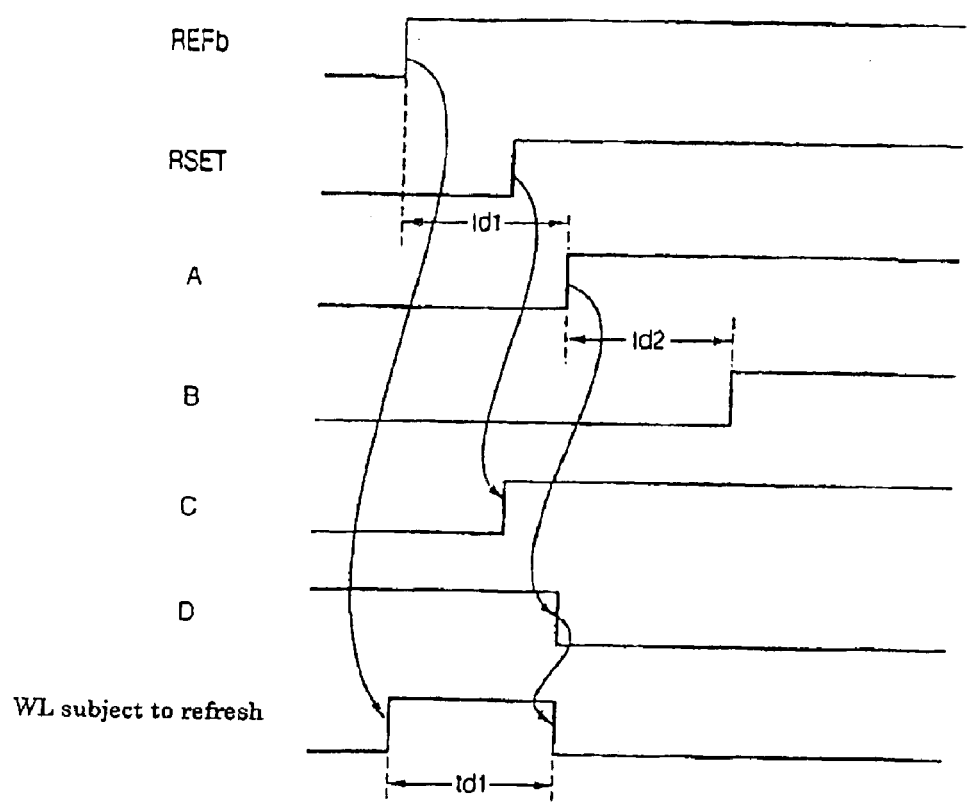
FIG. 14 is a timing chart illustrative of waveforms describing operations of the pulse generator circuit (in case of a minimum pulse width) in accordance with the second embodiment of the present invention.

Operations will be described with reference to FIG. 14 when the refresh operation is interrupted before the time td1 passes from selecting the word line. In this case, the signal A is transitioned to the high level after the signal C has been transitioned to the high level. The output signal D from the logic NAND-gate 150 is transitioned to the low level at the timing of the signal A, while the row enable signal RE is also transitioned to the low level at the timing of the signal A. Accordingly, the time period of selecting the word line WL is fixed at the delay time td1 of the delay circuit 110.

Figure 15:
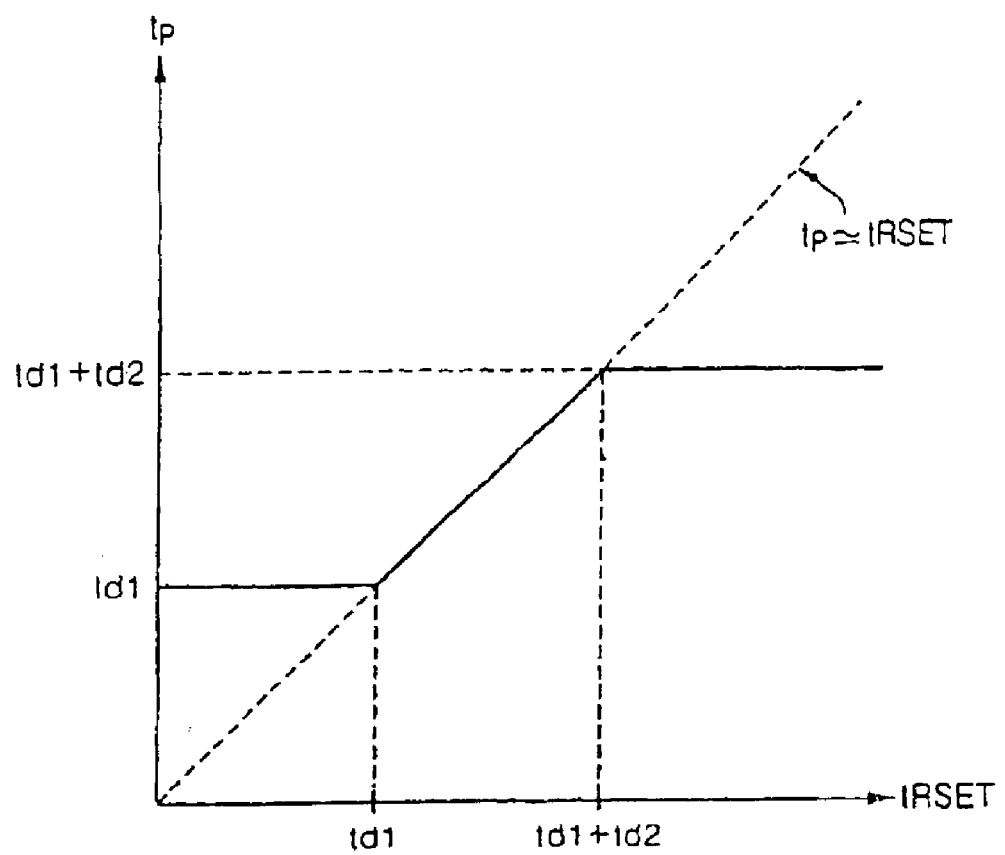
FIG. 15 is a diagram illustrative of a relationship between a word line selecting time period tp and a refresh operation interruption time tRSET of the pulse generator circuit in accordance with the second embodiment of the present invention.
Figure 16:
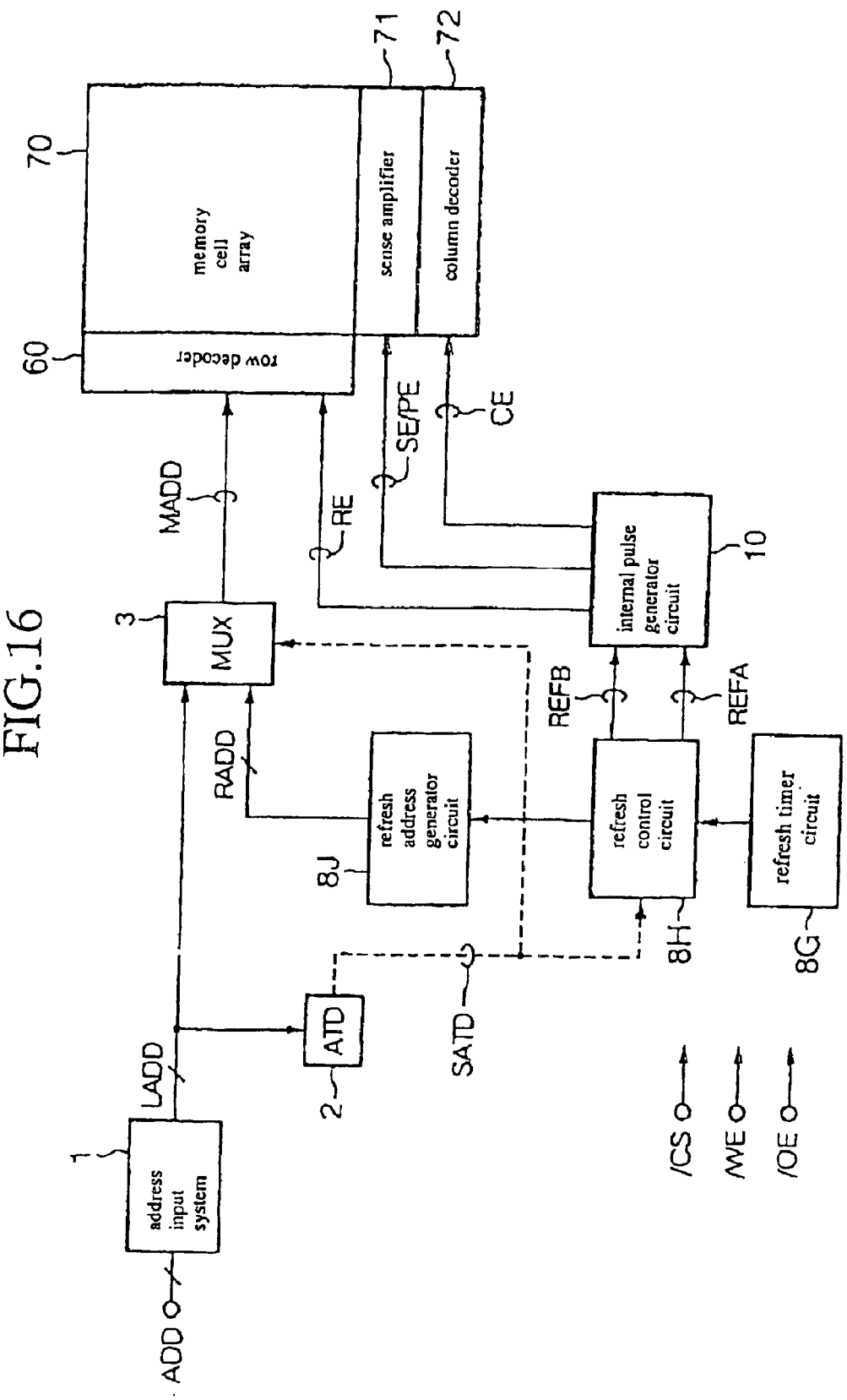
FIG. 16 is a block diagram illustrative of a configuration of the semiconductor memory device in accordance with the prior art.
Figure 17:
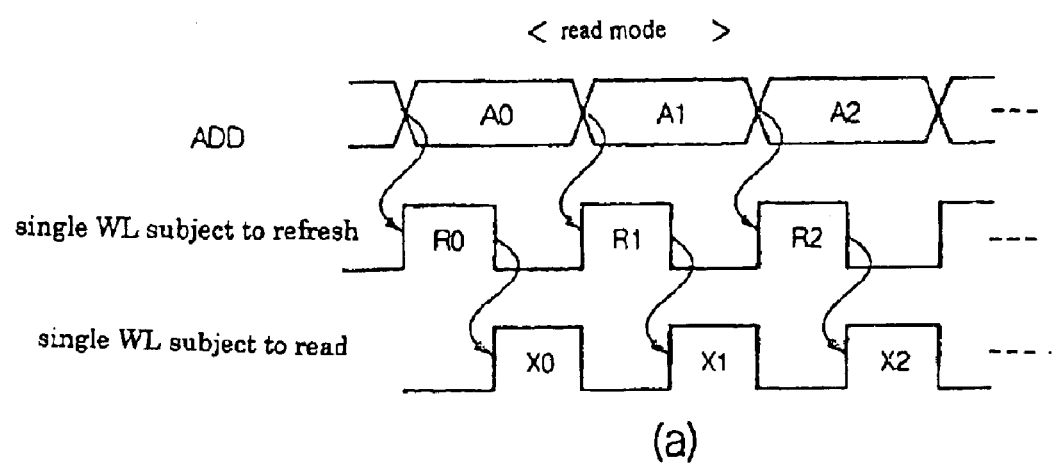
FIG. 17 is a timing chart illustrative of waveforms describing operations of the semiconductor memory device in accordance with the prior art.
Figure 17:
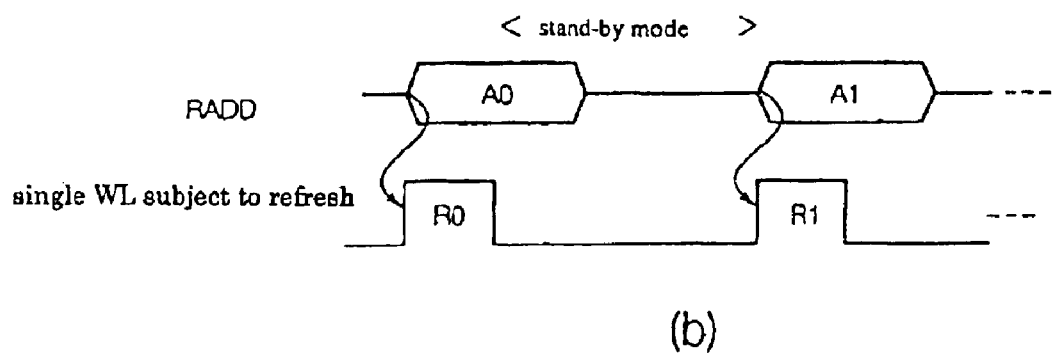

FIG. 15 shows a relationship between a time period tp of selecting the word line WL and a time tRSET until the signal RSET is generated. As shown in this drawing, the selecting time period tp is fixed at the delay time td1 until the time tRSET becomes beyond the delay time td1 of the delay circuit 110. After the time tRSET becomes beyond the delay time td1, then the selecting time period tp depends on the time tRSET. After the time tRSET becomes beyond the delay time (td1+td2), then the selecting time period tp is fixed at the delay time (td1+td2).

In accordance with this pulse generator circuit, at least the word selecting time period is ensured, which corresponds to the delay time of the delay circuit 110 thereby avoiding that the word line is placed into the non-selected state before the sense amplifier is activated. This prevents data from being broken due to the interruption of the refresh operation.

In accordance with the above-described embodiment, in addition to the reduction of the current comsumption caused by the refresh, it is also possible to effectively prevent that any refresh of the word line or any data break is caused by non-synchronous switch between the stand-by mode and the active mode.

(Fourth Embodiment)

In accordance with the above-described first to third embodiments, in the stand-by mode, the refresh cycle is longer by four times than that in the active mode, and also the four word lines are refreshed in parallel. Notwithstanding, it is possible that the refresh cycle in the stand-by mode is made longer than the self-refresh cycle in the active mode.

Figure 18:
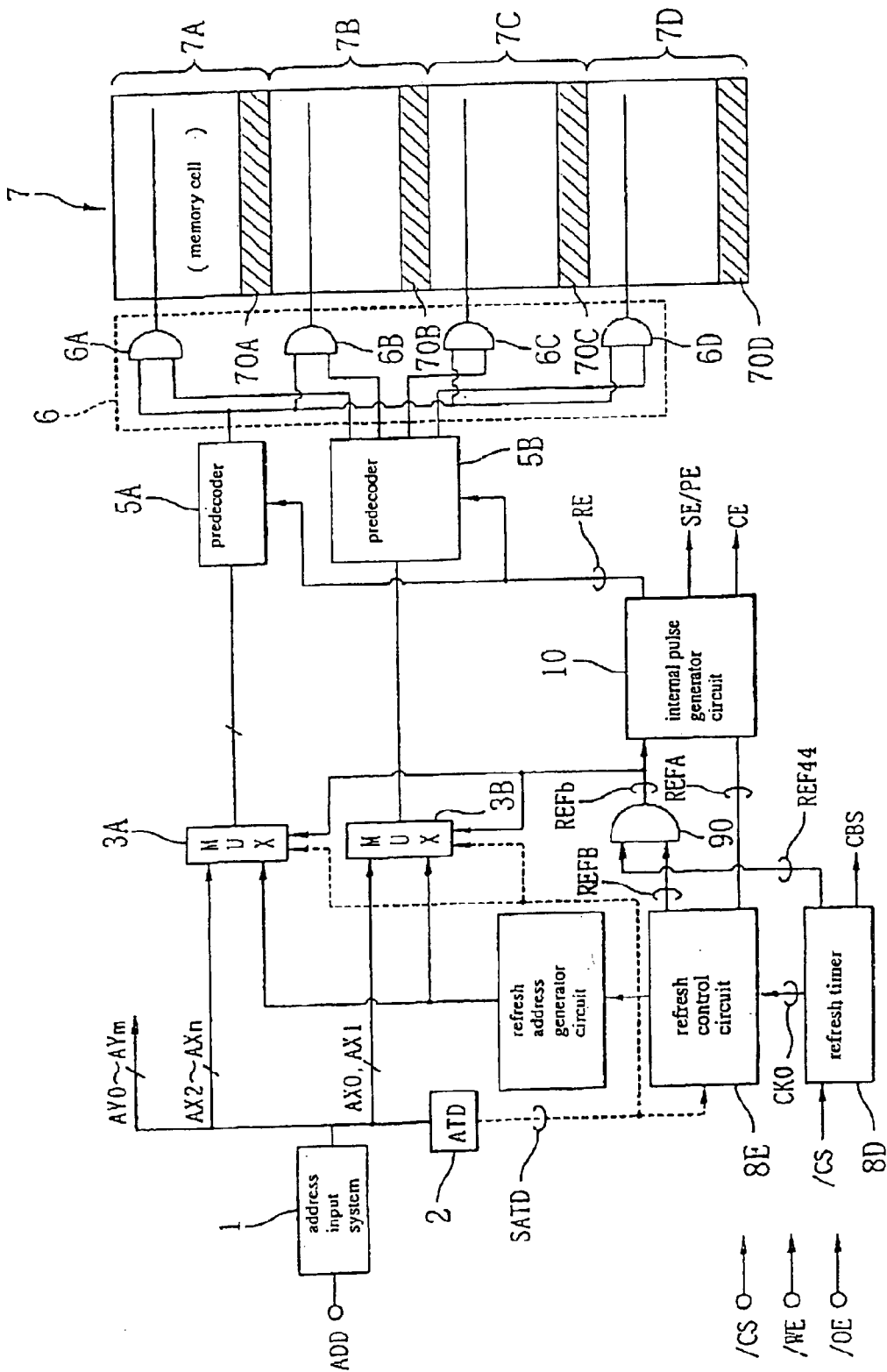
FIG. 18 is a block diagram illustrative of a configuration of a semiconductor memory device in accordance with a fourth embodiment of the present invention.

FIG. 18 is a block diagram showing the configuration of the semiconductor memory device in accordance with the fourth embodiment of the present invention. The configuration shown in FIG. 18 is the same as the configuration shown in FIG. 8, except that the gate circuit 4 of the second embodiment shown in FIG. 8 is omitted, and the output from the multiplexer 3B is supplied directly to the pre-decoder 5B.

In the above-described second embodiment, if the chip select signal/CS is transitioned to the high level and the operation mode-becomes the stand-by mode, then the logic gates 6A~6D are selected in parallel by the gate circuit 4 independently from the output from the pre-decoder 5B.

In accordance with this fourth embodiment, since the gate circuit 4 is absent, any one of the logic gates 6A~6D is exclusively selected by the output from the pre-decoder 5B even in the stand-by mode. Only a selected sub-block selected by the pre-decoder 5B from the sub-blocks 7A~7D is self-refreshed at a cycle longer by four times than the self-refresh cycle in the active mode.

Figure 19:
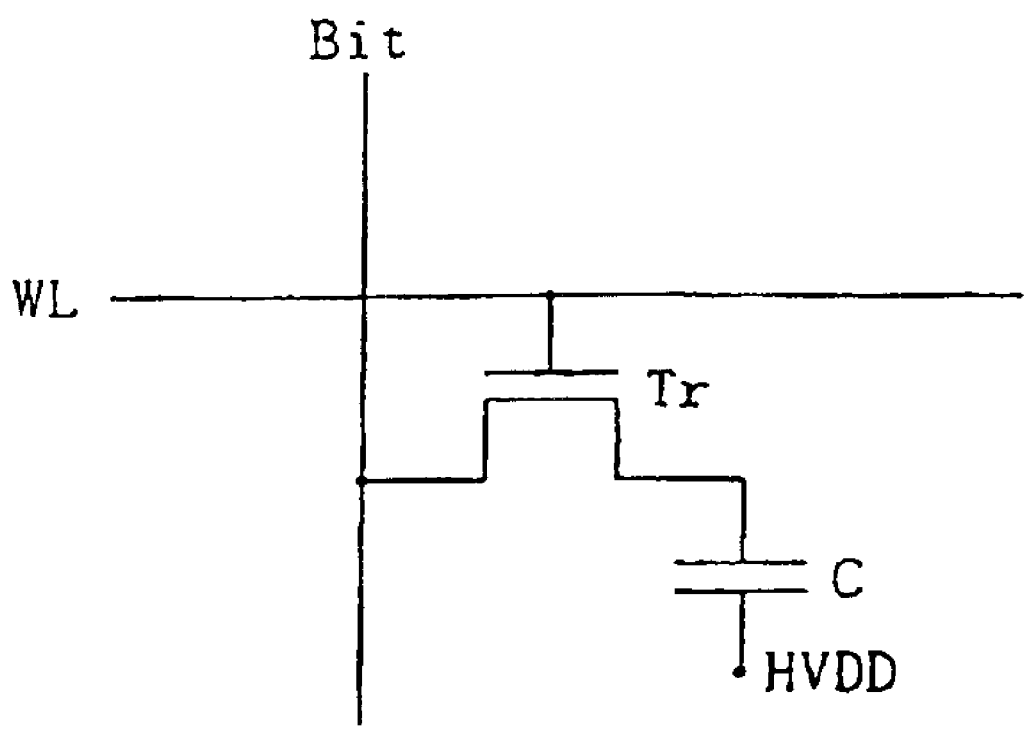
FIG. 19 is a block diagram illustrative of a configuration of a memory cell unit of the semiconductor memory device.

The reason why the self-refresh cycle in the stand-by mode can be made longer than the self-refresh in the active mode will hereinafter be described. FIG. 19 is a circuit diagram showing a single memory cell in the memory cell array 7. A gate of a memory cell transistor Tr is connected to a word line WL. One of a source and a drain of the memory cell transistor Tr is connected to a bit line Bit, and another of the source and drain of the memory cell transistor Tr is connected to one terminal of a memory cell capacitor C. Another terminal of the memory cell capacitor C is connected to an intermediate potential HVDD. This intermediate potential HVDD is an intermediate potential (½VDD) between the power voltage VDD and the ground level GND. The bit line is pre-charged at the intermediate potential HVDD. For storing data to the memory cell in the write operation or the refresh operation, the bit line Bit becomes VDD or GND depending upon the data to be stored.

In the active mode, read and write operations are executed other than the refresh operation, for which reason the bit line Bit becomes VDD or GND. Particularly, if the bit line Bit becomes GND, then even the word line WL is not selected, a leakage of current of the memory cell transistor Tr causes the memory cell capacitor C to loss the charge once accumulated therein. The self-refresh cycle in the active mode should be decided in consideration of the leakage of current caused in the read and write operations.

In contrast, in the stand-by mode, the read and write operations to the memory cell are inhibited, for which reason it is unnecessary to consider the leakage of current caused by the read and write operations. The potential of the bit line Bit is fixed at the intermediate potential HVDD except in the self-refresh. Accordingly, the self-refresh cycle in the stand-by mode can be made longer than the self-refresh cycle in the active mode. In the stand-by mode, there is no interference in the operation. This allows that the self-refresh cycle in the stand-by mode is longer than the self-refresh cycle in the active mode. The reason for this will be described with reference to FIGS. 20 and 21.

Figure 20:
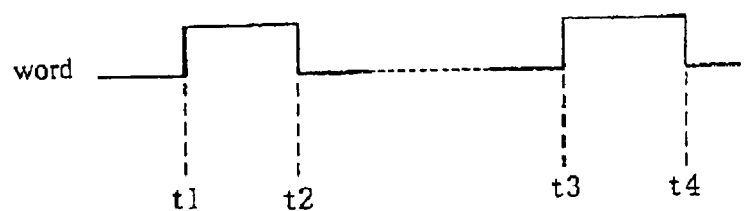
FIG. 20 is a timing chart illustrative of waveforms describing an access to a memory cell in the absence of read and write operations in the stand-by mode and the access mode.

FIG. 20 is a timing chart showing a state of access to the memory cell in the absence of read and write operations in the stand-by mode and in the active mode. A word line is selected in time periods of t1~t2 and t3~t4 for refresh operation. In the refresh interval between t2 and t3, no access is made to the memory cell. This allows a sufficient pre-charge to the bit line, whereby there is no interference between the refresh operation in the time period of t1~t2 and the other refresh operation in the time period of t3~t4.

Figure 21:
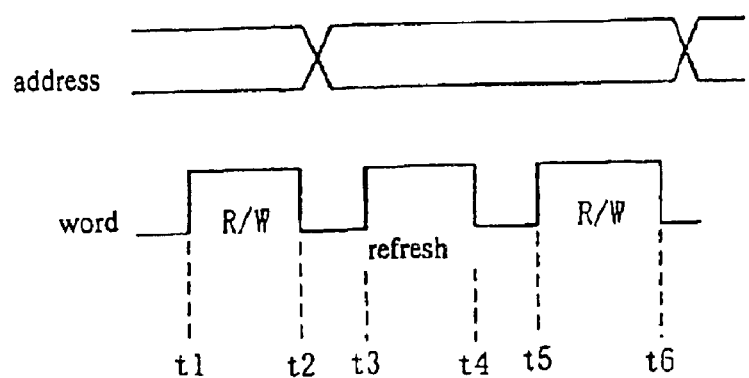
FIG. 21 is a timing chart illustrative of waveforms describing an access to a memory cell in the presence of read and write operations in the stand-by mode and the access mode.

FIG. 21 is a timing chart showing a state of access to the memory cell in the presence of read and write operations in the active mode. In FIG. 21, after the read/write operation is made to the memory cell in the time period of t1~t2, then the refresh is started upon transition of the address in the time period of t3~t4. Subsequent to the refresh operation, another read/write operation is made in the time period of t5~t6. In the time periods of the read/write operation to the refresh operation and of the refresh to the read/write, the pre-charges are made only in the minimum time periods of t2~t3 and t4~t5. Thus, a slightly insufficient pre-charge to the bit line causes any interference between the respective operations, resulting in a deterioration of the hold characteristic. Since it is impossible to presume whether the read/write operation to the memory cell is present or absent in the access mode, it is necessary to suppose the presence of the read/write operation in the access mode. For this reason, it is permitted that the self-refresh cycle in the stand-by mode free of any possibility of the interference of the operations is longer than the self-refresh cycle in the access mode with a possibility of the interference of the operations.

In the fourth embodiment, similarly to the second embodiment, even if the operation mode is switched from the active mode to the stand-by mode, the refresh is continued with the fixed short refresh cycle until the refresh has been completed to the word lines which should be refreshed in the active mode. Switching the refresh cycle accompanying to switching the operation mode will be described with reference to the timing chart of FIG. 22.

Figure 22:
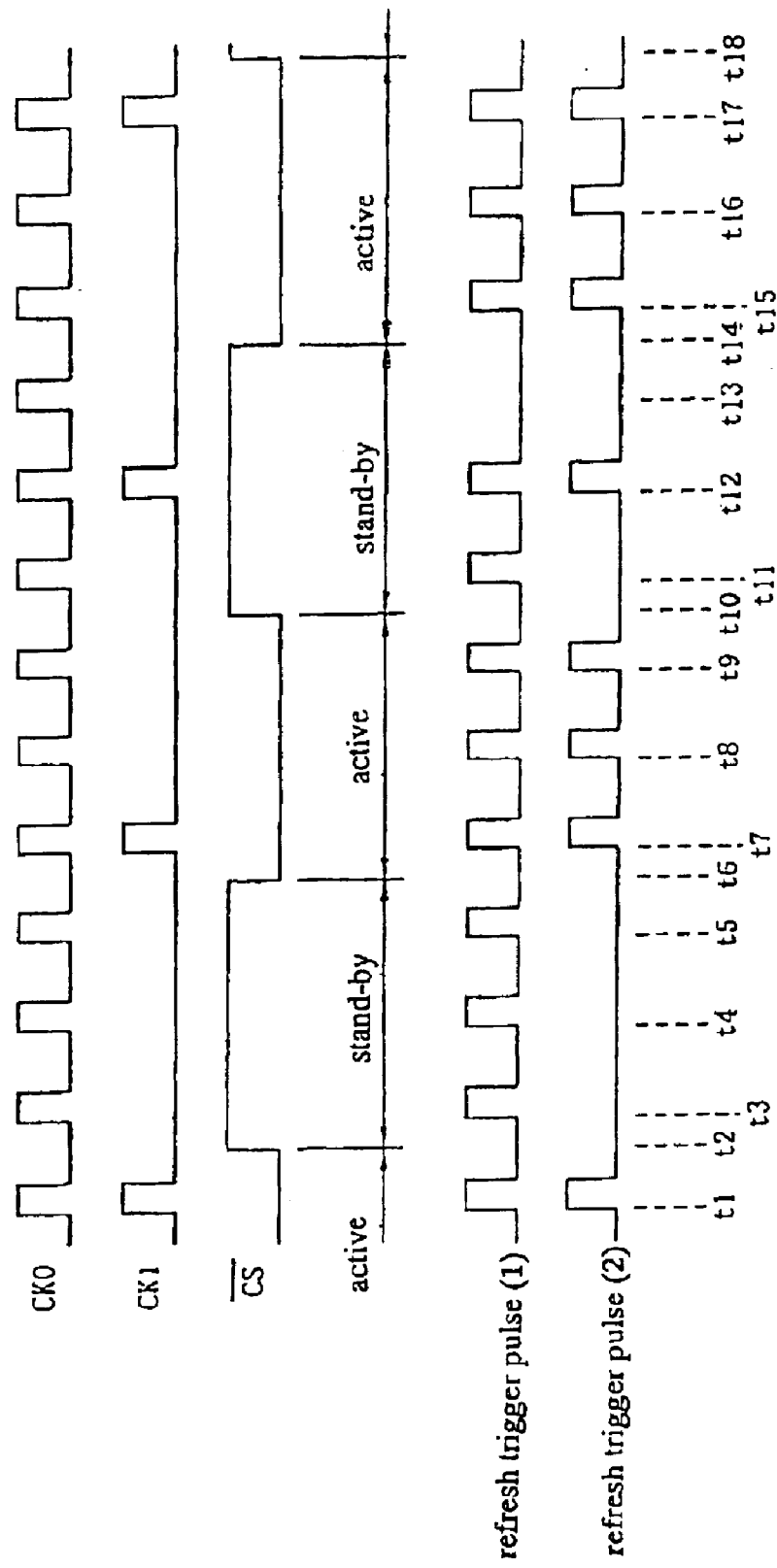
FIG. 22 is a timing chart illustrative of waveforms describing switching the operation modes of the semiconductor memory device in accordance with the fourth embodiment of the present invention.

In FIG. 22, the stand-by mode and the active mode are switched through a terminal/CS. Basically, the self-refresh is made in synchronizing with a short-cycle clock CL0 in the active mode, while the self-refresh is made in synchronizing with a long-cycle clock CL1 longer by four times than the clock CK0 in the stand-by mode.

For switching the active mode to the stand-by mode, as shown by "refresh trigger pulse (1)" in FIG. 22, without immediately switching the refresh trigger clock to CK1, the self-refresh is continued with the fixed self-refresh cycle in the active mode until the next pulse CK1 is outputted. If frequent switches between the active mode and the stand-by mode are caused, then as shown by "refresh trigger pulse (2)" in FIG. 22, the refresh cycle is shorter in average than when the refresh trigger pulse is switched to CK1 at the same time of switching the active mode to the stand-by mode. The reason of this is that if switches between the active mode and the stand-by mode are made at a short cycle, then it is possible that a disturbance similar to continuous active modes is caused to the memory cell. In order to avoid disappearance of memory cell data, the refresh cycle is shorter as mentioned above.

On the other hand, if the stand-by mode is continued, the self-refresh is made at the long trigger cycle of CK1, thereby reducing the current comsumption.

(Fifth Embodiment)

In accordance with the self-refresh timer circuits of the above-described first, second and fourth embodiments, the basic timer is used to generate a clock with the fixed cycle between the active mode and the stand-by mode, so that in the stand-by mode, the clock of the basic timer is frequency-divided by the frequency-divider to generate a self-refresh trigger pulse with a long cycle.

The fifth embodiment is that the basic timer of the self-refresh timer circuit is different in oscillation frequency between the stand-by mode and the active mode. A circuit of adjusting a current driving ability of the oscillation circuit to change the oscillation frequency is mentioned in Japanese laid-open patent publication No. 2001-184860. This fifth embodiment is to apply this circuit mentioned in Japanese laid-open patent publication No. 2001-184860 to control the oscillation frequency of the basic timer in the active mode and the stand-by mode.

Figure 23:
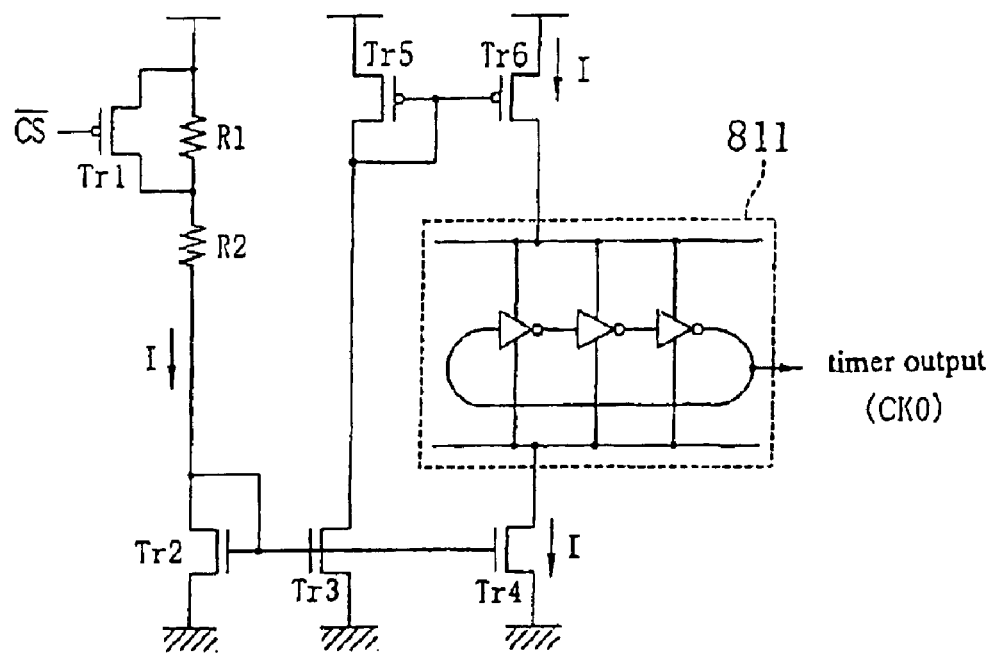
FIG. 23 is a block diagram illustrative of a configuration of a basic timer circuit in accordance with a fifth embodiment of the present invention.
Figure 24:
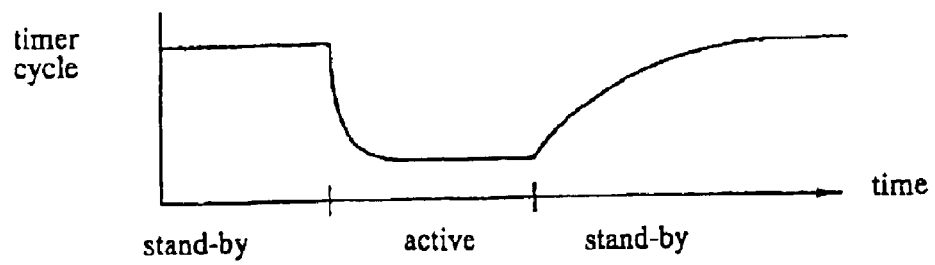
FIG. 24 is a graph illustrative of a variation in oscillation frequency of the basic timer circuit in accordance with the fifth embodiment of the present invention.

FIG. 23 is a circuit diagram illustrative of this self-refresh timer circuit. FIG. 24 is a graph showing switching the stand-by mode and the active mode and a cycle of the self-refresh trigger pulse.

In FIG. 23, a power current of a ring oscillator 81 is controlled by a current I flowing through a transistor Tr2 by a current mirror circuit which comprises transistors Tr2~Tr6, thereby to control an oscillation clock CK0 of the timer circuit. In the active mode, the transistor Tr1 is placed into the conductive state, and the current I flowing through the current mirror circuit is increased and the oscillation frequency of the ring oscillator 811 is shortened. By contrast, in the stand-by mode, the transistor Tr1 is placed into the non-conductive state, and the current I flowing through the current mirror circuit is decreased and the oscillation frequency of the ring oscillator 811 is made longer.

As shown in the graph of FIG. 24, the circuit of FIG. 23 a parasitic capacitance is present in the power supply of the ring oscillator 811 connected to the output from the transistors Tr4 and Tr6. This parasitic capacitance causes that the oscillation cycle of the ring oscillator 811 is not immediately changed but with a slight delay after the transistor Tr1 is switched between ON and OFF. A time necessary for increasing the power current to quicken the oscillation cycle is relatively longer than another time necessary for decreasing the power current to delay the oscillation frequency, for which reason if the switches between the active mode and the stand-by mode frequently appear, then the above oscillation cycle becomes closer to the oscillation cycle in the active mode than the oscillation cycle in the stand-by mode.

As stated in this embodiment and the above-fourth embodiment, it is possible to avoid any disappearance of the memory cell data even if the disturbance similar to the continuous active modes is made to the memory cell by a frequent switch between the active mode and the stand-by mode.

The technical concept of the present invention may also be applied to other semiconductor memory devices utilizing a late-write system, wherein data are stored in a later cycle than the data entry, but should not be limited to the above specification that the read/write operation and the refresh operation are executed in the same cycle.

Whereas the embodiments of the present invention have been described, the present invention should not be limited to those embodiments, but includes any design changes within the subject matters of the present invention.

INDUSTRIAL APPLICABILITY

As described above, in accordance with the present invention, the semiconductor memory device has a plurality of memory cells which need refresh for holding memories, as well as the semiconductor memory device has the stand-by mode inhibiting the external read and write operation of data to the memory cells, and the active mode enabling the external read and write operation of data to the memory cells, wherein in the active mode, the self-refresh is made at the first cycle, and in the stand-by mode, the self-refresh is made at the second cycle longer than the first cycle, thereby to reduce effectively the current comsumption caused by the self-refresh operation in the stand-by mode.

In another aspect of the present invention, for refresh operation in the stand-by mode with the self-refresh timer circuit, the control system is provided, so that the current driving ability is controlled of the sense amplifier provided for amplifying the data signal appearing on the bit line, and the pulse width is expanded of the pulse signal defining the time period of selecting the word line, and a plurality of word lines are activated in parallel based on the pulse signal with the expanded pulse width. This effectively reduces the current consumption caused by the self-refresh operation in the stand-by mode.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A semiconductor memory device, comprising:
    a plurality of memory cells which need refreshes for memory holds, as well as a stand-by mode inhibiting read and write operations of external data from and into said memory cells, and an active mode enabling said read and write operations of external data from and into said memory cells, and
    a self-refresh timer circuit which outputs refresh pulses for a self-refresh at a first cycle in said active mode and for another self-refresh at a second cycle longer than said first cycle in said stand-by mode.

2. The semiconductor memory device as claimed in claim 1, wherein said self-refresh timer circuit outputs said refresh pulse for said self-refresh at said first cycle if any external read and write operations to said memory cells are absent for a predetermined period of time in said active mode.

3. The semiconductor memory device as claimed in claim 1, wherein said self-refresh timer circuit includes an oscillator circuit having an oscillation cycle in said stand-by mode, which is longer than another oscillation cycle in said active mode.

4. The semiconductor memory device as claimed in claim 1, wherein said self-refresh timer circuit includes a frequency divider circuit for frequency dividing a short-cycle-clock into a long-cycle-clock, so that said self-refresh timer circuit outputs said refresh pulse based on said short cycle-clock in said active mode, and also outputs said other refresh pulse based on said long-cycle-clock in said stand-by mode.

5. The semiconductor memory device as claimed in claim 1, wherein said self-refresh timer circuit is adopted so that a time period until said refresh cycle is changed from said second cycle to said first cycle after said stand-by mode is changed to said active mode is longer in average than another time period until said refresh cycle is changed from said first cycle to said second cycle after said active mode is changed to said stand-by mode.

6. The semiconductor memory device as claimed in claim 1, further comprising a sense amplifier circuit for amplifying a data signal having been read of said memory cell, wherein said sense amplifier circuit more suppresses a current driving ability in said stand-by mode than in said stand-by mode.

7. The semiconductor memory device as claimed in claim 1, further comprising: a plurality of word lines respectively connected to said plurality of memory cells; and a word line selecting circuit for selectively activating said word lines connected to memory cells which are subject to at least said self-refresh, wherein said word line selecting circuit controls said activation so that a time period for activating the word line is made longer in said stand-by mode than in said active mode.

8. The semiconductor memory device as claimed in claim 7, wherein said word line selecting circuit activates in parallel said plurality of word lines for said self-refresh in said stand-by mode.

9. The semiconductor memory device as claimed in claim 7, further comprising a control system for controlling a current driving ability of a sense amplifier provided for amplifying a data signal appearing on a bit line involved in a refresh operation in a stand-by mode, and said control system also expands a pulse width of a pulse signal which defines a period of time for selecting a word line, and said control system activates in parallel said plurality of word lines, based on said pulse signal with said expanded pulse width, thereby to execute said refresh operation automatically.

10. The semiconductor memory device as claimed in claim 9, wherein said control system detects a switch of said operation mode from said active mode into said stand-by mode, and said control system activates in parallel said plurality of word lines including a word line designated by said row address to be subject to said refresh in said active mode.

11. The semiconductor memory device as claimed in claim 9, wherein said control system generates, as said pulse signal, a signal with a pulse width necessary for activating at least said sense amplifier.

12. The semiconductor memory device as claimed in claim 9, wherein said control system controls said current driving ability to be small, which is of said sense amplifier and also expands a pulse width of said pulse signal, as long as data stored in a memory cell subject to said refresh is recovered.

13. A semiconductor memory device of non-synchronous type which is configured to automatically perform a refresh operation, comprising:
    a control system for controlling a current driving ability of a sense amplifier provided for amplifying a data signal appearing on a bit line involved in a refresh operation in a stand-by mode, and said control system also expands a pulse width of a pulse signal which defines a period of time for selecting a word line, and said control system activating in parallel said plurality of word lines, based on said pulse signal with said expanded pulse width,
    wherein if a current refresh operation is interrupted when an operation mode is switched from said stand-by mode into said active mode, then said control system performs, in a subsequent active mode, said refresh operation again to a word line designated by a row address which has been subject to said interrupted refresh.

14. A semiconductor memory device of non-synchronous type which is configured to automatically perform a refresh operation, comprising:
    a control system for controlling a current driving ability of a sense amplifier provided for amplifying a data signal appearing on a bit line involved in a refresh operation in a stand-by mode, and said control system also expands a pulse width of a pulse signal which defines a period of time for selecting a word line, and said control system activating in parallel said plurality of word lines, based on said pulse signal with said expanded pulse width, wherein said control system continues said refresh operation in said active mode until a new refresh cycle arrives in said stand-by mode, after said operation mode has been switched from said active mode into said stand-by mode.

15. A method of refreshing automatically a semiconductor memory device having a plurality of memory cells which need refreshes for memory holds, as well as a stand-by mode inhibiting read and write operations of external data from and into said memory cells, and an active mode enabling said read and write operations of external data from and into said memory cells, said method comprising:

(a) controlling a current driving ability of a sense amplifier provided for amplifying a data signal appearing on a bit line involved in a refresh operation in a stand-by mode;

(b) expanding a pulse width of a pulse signal which defines a period of time for selecting a word line;

(c) activating in parallel said plurality of word lines, based on said pulse signal with said expanded pulse width; and (d) conducting a self-refresh at a first cycle in said active mode and another self-refresh at a second cycle longer than said first cycle in said stand-by mode.

16. A refresh method of a semiconductor memory device of non-synchronous type which is configured to automatically perform a refresh operation, said method including: a stand-by mode inhibiting read and write operations of data from and into said memory cells, and an active mode enabling said read and write operations of data from and into said memory cells, wherein a self-refresh cycle in said stand-by mode is longer than another self-refresh cycle in said active mode.

17. The refresh method of said semiconductor memory device as claimed in claim 16, wherein when said stand-by mode is changed into said active mode, then said self-refresh cycle is shortened rapidly, and when said active mode is changed into said stand-by mode, then said self-refresh cycle is slowly expanded.

* * * * *